United States Patent
Saito et al.

(10) Patent No.: US 7,511,991 B2
(45) Date of Patent: *Mar. 31, 2009

(54) SPIN-INJECTION MAGNETIC RANDOM ACCESS MEMORY

(75) Inventors: Yoshiaki Saito, Kawasaki (JP); Hideyuki Sugiyama, Yokohama (JP); Tomoaki Inokuchi, Kawasaki (JP); Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

This patent is subject to a terminal disclaimer.

(21) Appl. No.: 11/750,856

(22) Filed: May 18, 2007

(65) Prior Publication Data

US 2007/0223269 A1 Sep. 27, 2007

Related U.S. Application Data

(63) Continuation of application No. 11/242,906, filed on Oct. 5, 2005, now Pat. No. 7,239,541.

(30) Foreign Application Priority Data

Jan. 28, 2005 (JP) ............................. 2005-021877

(51) Int. Cl.
*G11C 11/00* (2006.01)
*G11C 11/14* (2006.01)

(52) U.S. Cl. .................... 365/158; 365/171; 365/173

(58) Field of Classification Search ............... 365/158, 365/171, 173
See application file for complete search history.

(56) References Cited

U.S. PATENT DOCUMENTS 6,256,223 B1 7/2001 Sun
6,724,651 B2 4/2004 Hirai
6,853,580 B2 2/2005 Nishimura
6,885,577 B2 4/2005 Tang et al.
7,119,410 B2 10/2006 Saito et al.

OTHER PUBLICATIONS

Yiming Huai, et al. "Observation of spin-transfer switching in deep submicron-sized and low-resistance magnetic tunnel junctions", Applied Physics Letters, vol. 84, No. 16, Apr. 19, 2004, pp. 3118-3120.

(Continued)

*Primary Examiner*—Trong Phan
(74) *Attorney, Agent, or Firm*—Oblon, Spivak, McClelland, Maier & Neustadt, P.C.

(57) ABSTRACT

A spin-injection magnetic random access memory according to an embodiment of the invention includes a magnetoresistive element having a magnetic fixed layer whose magnetization direction is fixed, a magnetic recording layer whose magnetization direction can be changed by injecting spin-polarized electrons, and a tunnel barrier layer provided between the magnetic fixed layer and the magnetic recording layer, a bit line which passes spin-injection current through the magnetoresistive element, the spin-injection current being used for generation of the spin-polarized electrons, a writing word line through which assist current is passed, the assist current being used for the generation of an assist magnetic field in a magnetization easy-axis direction of the magnetoresistive element, and a driver/sinker which determines a direction of the spin-injection current and a direction of the assist current.

12 Claims, 29 Drawing Sheets

OTHER PUBLICATIONS

T. Ochiai, et al., "Substantial reduction of critical current density for CPP-GMR with an antisymmetric structure", 49th MMM Conferences Digest, ES-08, p. 271, Nov. 2004.

S. Haneda, et al., "Current Induced Magnetic Switching in Nanopillar with Two Pinned Layers", 49th MMM Conferences Digest, HA-05, p. 394, Nov. 2004.

G.D. Fuchs, et al., "Spin Transfer Effects in Magnetic Tunnel Junctions", 49th MMM Conferences Digest, HA-12, p. 396, Nov. 2004.

Magnetization reversal process

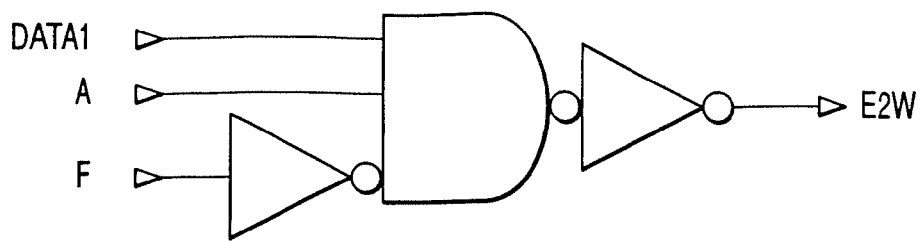
F I G. 2 9
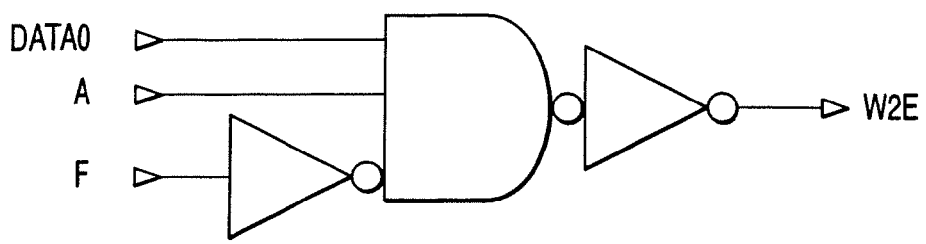
F I G. 3 0
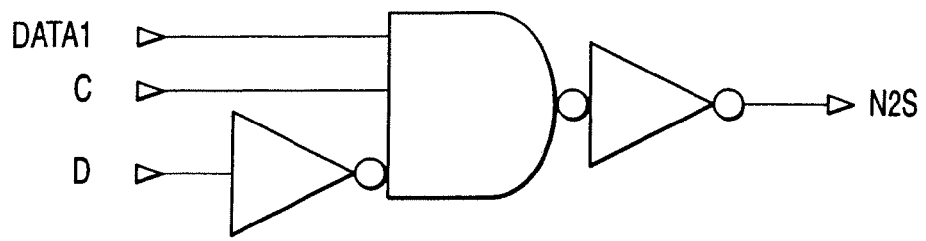
F I G. 3 1
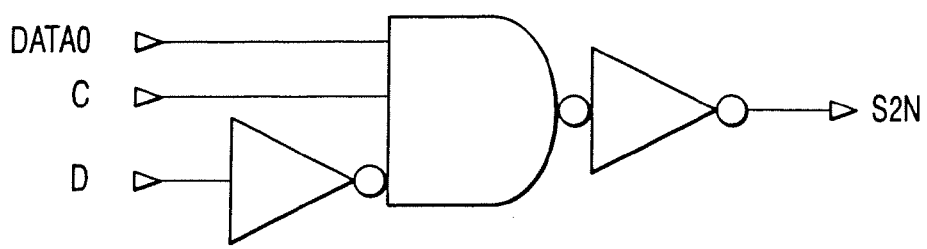
F I G. 3 2

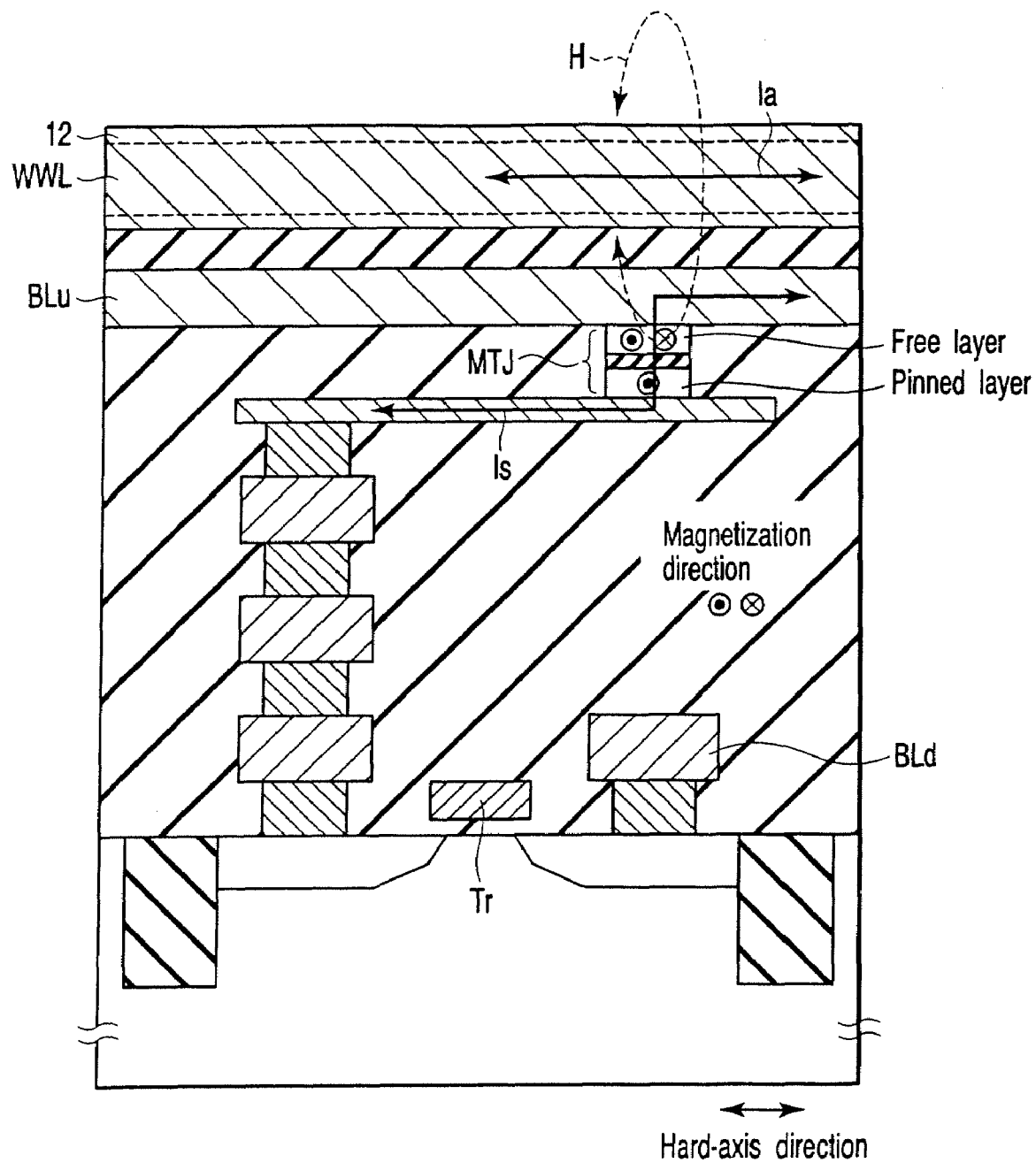
F I G. 38

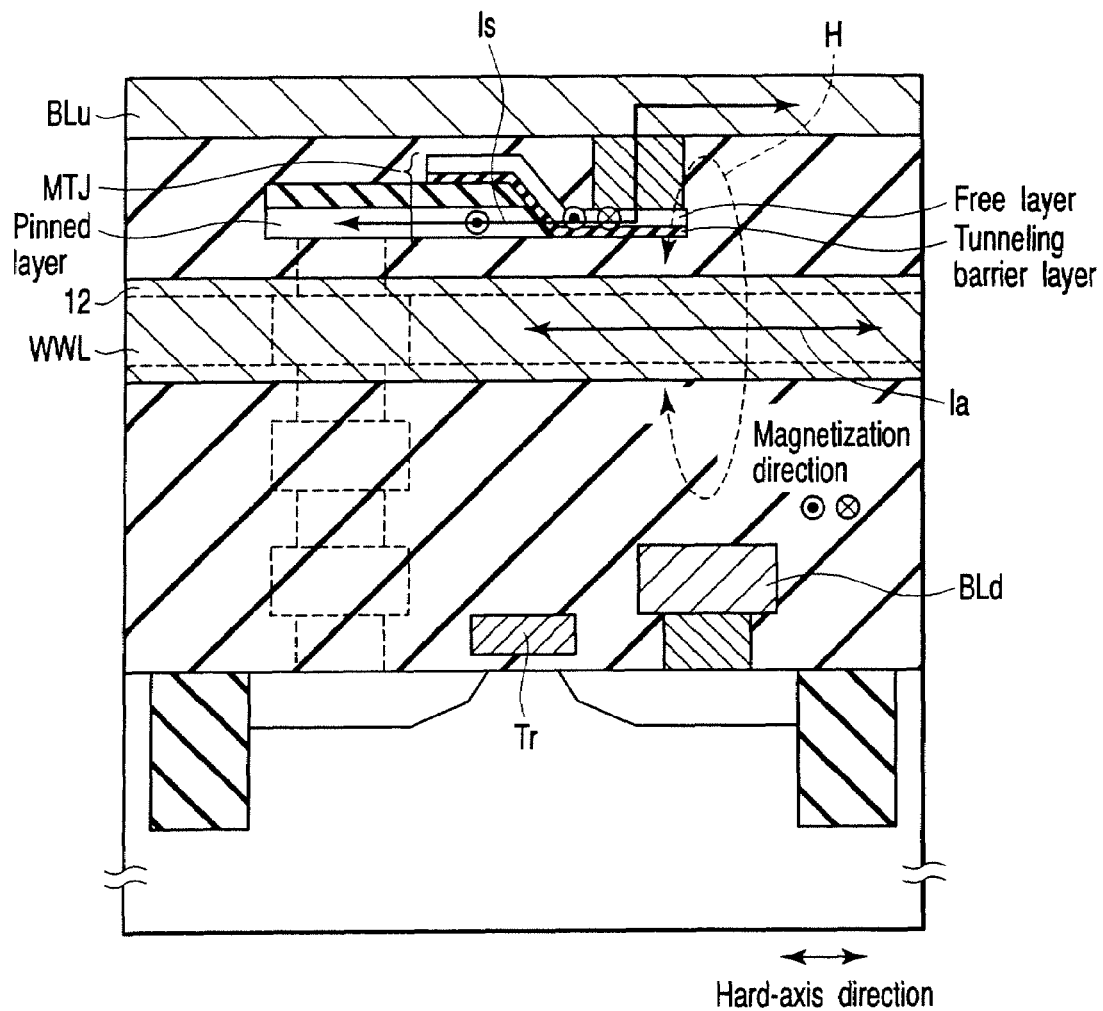
F I G. 4 4

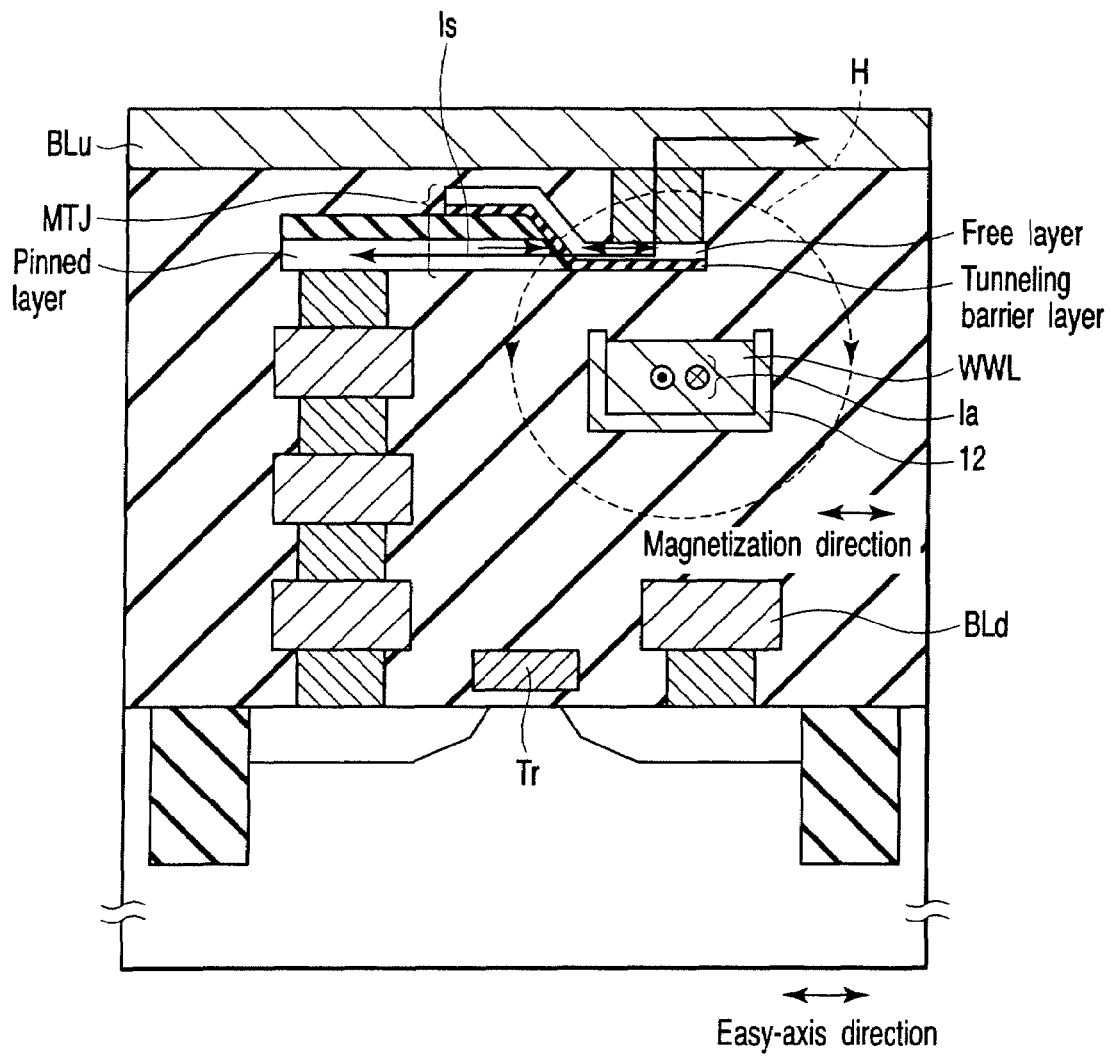
F I G. 45

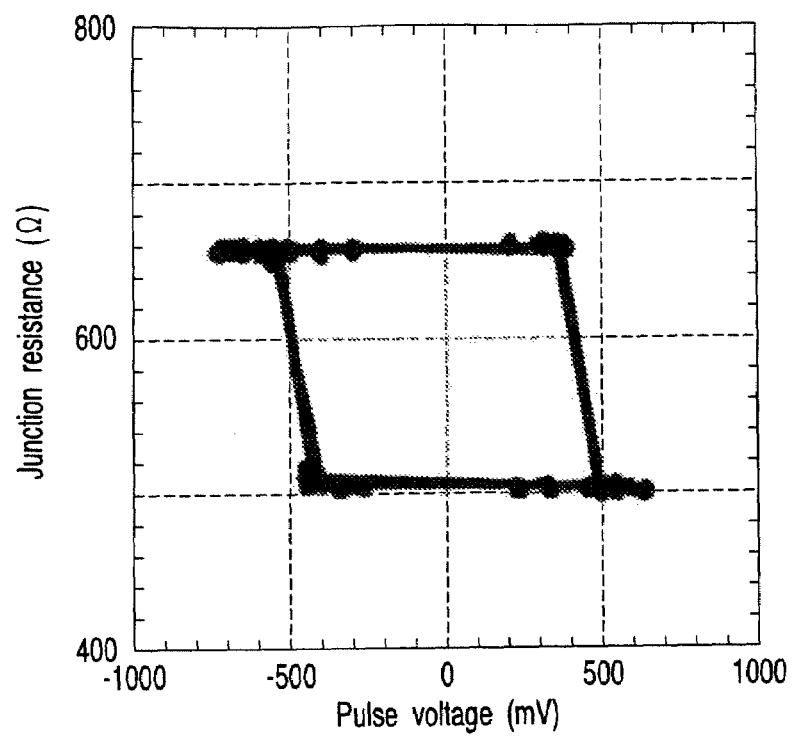
F I G. 4 8
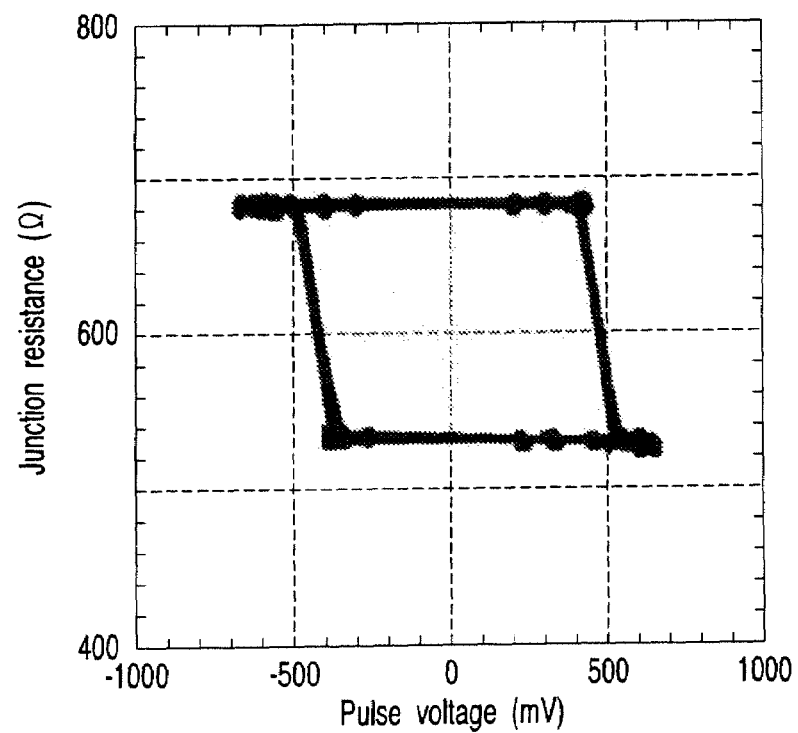
F I G. 4 9

SPIN-INJECTION MAGNETIC RANDOM ACCESS MEMORY

CROSS-REFERENCE TO RELATED APPLICATIONS

This application is a continuation application of, and claims the benefit of priority under 35 U.S.C. § 120 from, Ser. No. 11/242,906, filed Oct 5, 2005, now U.S. Patent No. 7,239,541, issued Jul. 3, 2007, which claims the benefit of priority under 35 U.S.C. § 119 from Japanese patent application No. 2005-021877, filed Jan. 28, 2005. The entire contents of each of the above applications are incorporated herein by reference.

BACKGROUND OF THE INVENTION

1. Field of the Invention

The present invention relates to a spin-injection magnetic random access memory in which magnetization reversal is performed with spin-polarized electrons.

2. Description of the Related Art

In addition to magnetic heads and detection elements such as a magnetic sensor, a magnetoresistive element in which a magnetic film is used has been studied for the use of a storage element in a magnetic random access memory (MRAM), which is of a solid-state magnetic memory.

The magnetoresistive element has a sandwich structure, which includes, e.g., two magnetic metal layers and a dielectric layer arranged there between. In the magnetoresistive element having the sandwich structure, because magnetization states of the two magnetic metal layers differ depending on the data, the data can be read by utilizing tunneling magnetoresistance (TMR) effect.

Recently, for an MR ratio (magnetoresistive ratio), which indicates a magnetoresistive fluctuation rate, the magnetoresistive element having the MR ratios more than 20% at room temperature is obtained, and research and development of the magnetic random access memory is actively conducted.

The magnetoresistive element in which the TMR effect is utilized can be realized as follows: After an Al (aluminum) layer having thicknesses ranging from 0.6 nm to 2.0 nm is formed on a ferromagnetic body which is of the magnetic metal layer, a surface of the Al layer is exposed to oxygen glow discharge or oxygen gas to form a tunnel barrier layer made of $Al_2O_3$, and the ferromagnetic body which is of the magnetic metal layer is further formed.

Instead of $Al_2O_3$, MgO (magnesium oxide) can also be used as the tunnel barrier layer.

A ferromagnetic single-tunnel junction element is proposed as another structure of the magnetoresistive element in which the TMR effect is utilized. In the ferromagnetic single-tunnel junction element, for example, one of two ferromagnetic layers is formed in a magnetic fixed layer whose magnetization state is fixed by an anti-ferromagnetic layer. Further, a magnetoresistive element, which has a ferromagnetic tunnel junction through magnetic particles dispersed in a dielectric body and a ferromagnetic double-tunnel junction element in which the ferromagnetic body is formed in a continuous film are also proposed.

These magnetoresistive elements have been considered to have a high potential for application, because the MR ratios range from 20% to 230% and a decrease in MR ratio is suppressed even if voltage applied to the magnetoresistive element is increased.

In the magnetic random access memory in which the magnetoresistive element is used, a readout time is as fast as not more than 10 nano seconds and rewritable endurance is as large as at least $10^{15}$ times.

However, the data writing (magnetization reversal) in the magnetic recording layer is performed with a magnetic field generated by pulse current. Therefore, current density of the pulse current supplied to a word line or a bit line is increased, which results in new problems that electric power consumption is increased, large memory capacity is difficult to be realized, and a driver for generating the pulse current is increased in an area.

Therefore, there is proposed a yoke wiring technology in which a magnetic material (yoke material) having high magnetic permeability is provided around a writing line to impart efficiently the magnetic field to the magnetoresistive element. According to this technology, the current density of the pulse current generated during the data writing can be decreased.

However, the pulse current cannot still be decreased to a value required for the practical use of the magnetic random access memory, i.e., the values not more than 1 mA.

The writing method by the spin injection is proposed as the technology, which solves these problems at a stroke.

The spin-injection writing method has a feature in that the magnetization reversal of the magnetic recording layer is performed by injecting the spin-polarized electrons into the magnetic recording layer of the magnetoresistive element.

When the magnetization reversal is performed by the spin-polarized electrons, because the current density of the pulse current can be decreased compared with the case in which the magnetization reversal is performed by the magnetic field, the spin-injection writing method can contribute to the electric power consumption reduction, the enlargement of memory capacity, the driver area reduction, and the like. In this case, in order not to generate the ring magnetic field by the pulse current, because it is necessary to decrease dimensions of the magnetoresistive element, it is convenient to integrate the magnetoresistive element.

In order to realize the spin-injection writing method, firstly, it is necessary that thermal stability (thermal fluctuation resistance) is ensured when the dimensions of the magnetoresistive element is equal to or smaller than 0.1×0.1 μm2. Second it is necessary that a fluctuation in dimension of the magnetoresistive element is decreased. Third it is necessary that the current density of the pulse current required for the spin-injection magnetization reversal is decreased.

Currently the current density of the pulse current required for the spin-injection magnetization reversal is about $10^7$ $A/cm^2$, however, the further reduction of the current density is desired in order to prevent a tunnel barrier breakage problem and the like.

In the magnetoresistive element in which giant magnetoresistance (GMR) effect is utilized, the current density of the pulse current can be decreased to a degree of $10^6$ $A/cm^2$ by adopting the so-called dual-pin structure. For example, in the case where $Cu/Co_{90}Fe_{10}$, $Ru/Co_{90}Fe_{10}$ is used as a spin reflection film, the current densities of the pulse current required for the spin-injection magnetization reversal become about $8×10^6$ $A/cm^2$ and about $2×10^6$ $A/cm^2$ respectively.

However, these values are not still enough to realize the magnetic random access memory. In order to solve the problems such as the tunnel barrier breakage and the thermal disturbance caused by the temperature rise of the magnetoresistive element, it is necessary to conduct the research and development of a new architecture and writing method, which can realize the further reduction of the current density.

SUMMARY OF THE INVENTION

A spin-injection magnetic random access memory according to one aspect of the present invention comprises: a magnetoresistive element having a magnetic fixed layer whose magnetization direction is fixed, a magnetic recording layer whose magnetization direction can be changed by injecting spin-polarized electrons, and a tunnel barrier layer which is provided between the magnetic fixed layer and the magnetic recording layer; a bit line which passes spin-injection current through the magnetoresistive element, the spin-injection current being used for generation of the spin-polarized electrons; a writing word line through which assist current is passed, the assist current being used for the generation of an assist magnetic field in a magnetization easy-axis direction of the magnetoresistive element; a first driver/sinker which is connected to the bit line; a second driver/sinker which is connected to the writing word line; a first decoder which controls the first driver/sinker to determine a direction of the spin-injection current according to a value of writing data in writing data in the magnetoresistive element while determining timing of cutoff of the spin-injection current; and a second decoder which controls the second driver/sinker to determine the direction of the spin-injection current according to the value of the writing data during the data writing while making the timing of the cutoff of the assist current later than the timing of the cutoff of the spin-injection current.

BRIEF DESCRIPTION OF THE DRAWING

FIG. 29 shows an example of an active signal E2W generating circuit;

FIG. 30 shows an example of an active signal W2E generating circuit;

FIG. 31 shows an example of an active signal N2S generating circuit;

FIG. 32 shows an example of an active signal S2N generating circuit;

FIG. 38 is a sectional view showing a modification of the first embodiment of the structure;

FIG. 44 is a sectional view showing the modification of the second embodiment of the structure;

FIG. 45 is a sectional view showing the modification of the second embodiment of the structure;

FIG. 48 shows the thermal disturbance of the magnetoresistive element; and

FIG. 49 shows the thermal disturbance of the magnetoresistive element.

DETAILED DESCRIPTION OF THE PREFERRED EMBODIMENTS

A spin-injection magnetic random access memory of an aspect of the present invention will be described below in detail with reference to the accompanying drawings.

1. Architecture and Writing Method

(1) Thermal Disturbance

Figure 1:
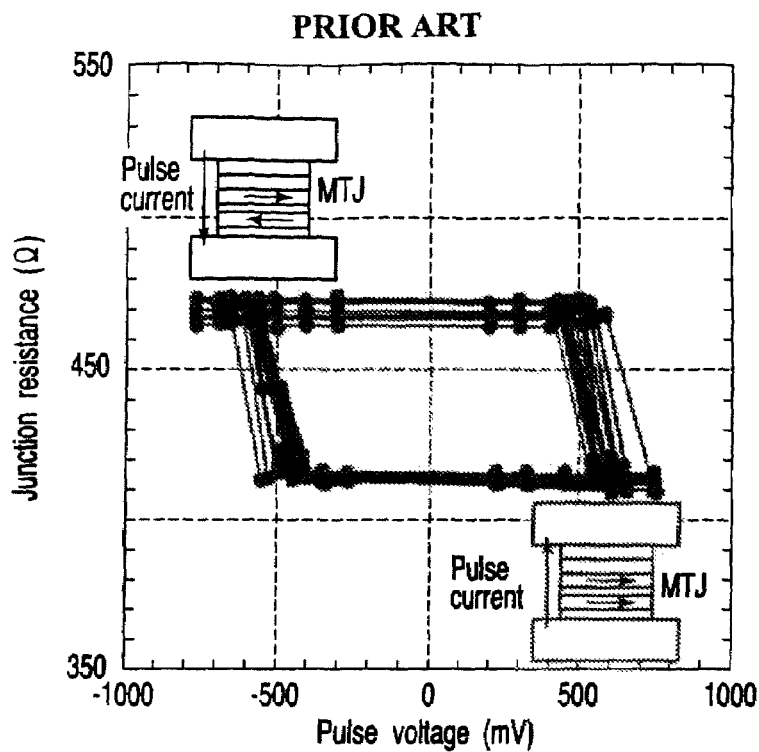
FIG. 1 shows thermal disturbance of a magnetoresistive element.

FIG. 1 shows the thermal disturbance of the conventional magnetoresistive element.

It is assumed that the magnetization reversal by the spin injection is performed with the pulse current (spin-polarized electrons) having a pulse width of 50 ns.

When the magnetization reversal (switching) is performed by supplying the pulse current to a magnetoresistive element MTJ, a fluctuation in current density (corresponding to pulse voltage) of the pulse current required for the switching and a fluctuation in magnetoresistive fluctuation rate (corresponding to junction resistance) of post-switching are generated in each writing.

It is thought that the fluctuations are caused by the pulse current supplied to the magnetoresistive element MTJ during the switching. That is, the pulse current causes temperature rise of the magnetoresistive element MTJ. It is believed that the temperature rise of the magnetoresistive element MTJ has some effects on the magnetic recording layer (free layer) during the switching.

Figure 2:
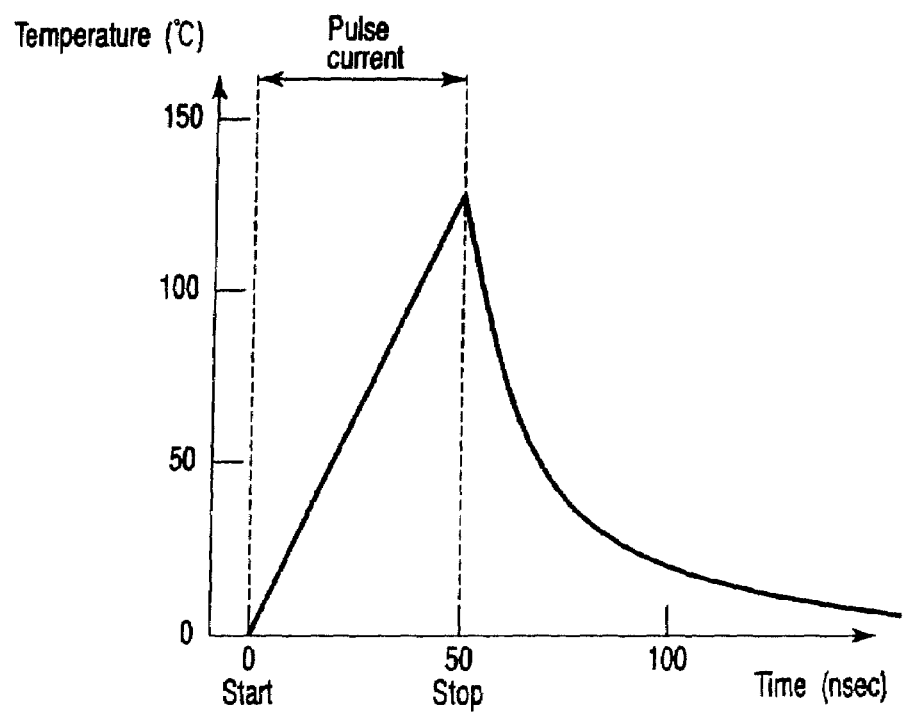
FIG. 2 shows temperature rise of the magnetoresistive element during spin-injection writing.

FIG. 2 shows the temperature rise of the magnetoresistive element when the magnetization reversal is performed with the pulse current having the pulse width of 50 ns.

While the pulse current is supplied to the magnetoresistive element, the temperature of the magnetoresistive element is increased at a constant rate. The temperature is increased up to 130° C. After the pulse current is cut off, it takes tens nanoseconds to sufficiently cool the magnetoresistive element. For example, in the embodiments, it takes at least 50 ns to sufficiently cool the magnetoresistive element.

(2) Structure

In embodiments of the invention, the magnetic field in a magnetization easy-axis direction of the magnetoresistive element is used as assist for the magnetization reversal (switching) in the spin-injection magnetic random access memory in which the magnetization reversal is performed by the spin-polarized electrons.

That is, in the spin-injection magnetization reversal method, although the recording layer is largely affected by the thermal fluctuation because the magnetization reversal is performed by encouraging electron spin precession, the assist magnetic field suppresses the thermal disturbance by the electron spin in the recording layer until the temperature of the magnetoresistive element which rises due to the spin-polarized electrons sufficiently falls down.

Thus, when the assist magnetic field is imparted during the magnetization reversal with the spin-polarized electrons, the electron spin precession is suppressed to decrease the fluctuation in characteristics of the magnetoresistive element due to the thermal disturbance.

Further, the assist magnetic field decreases the current density of the pulse current used for the spin-injection magnetization reversal, which allows the problems such as the tunnel barrier breakage to be prevented.

The assist magnetic field in the magnetization easy axis direction of the magnetoresistive element does not mainly perform the magnetization reversal, but suppress the electron spin thermal disturbance in the free layer during the switching, so that assist currents not more than 1 mA are enough to generate the assist magnetic field. It should also be noted that the magnetization reversal is not performed only by the assist magnetic field.

(i) First Embodiment

FIGS. 3 to 6 show a first embodiment of the structure.

A memory cell includes one MOS transistor Tr and one magnetoresistive element MTJ.

One end of the magnetoresistive element MTJ is connected to a bit line BLu, and the other end is connected to a bit line BLd through the MOS transistor TR, which is of a selection element. The two bit lines BLu and BLd are arranged so as to intersect each other.

In the embodiment, the bit line BLu extends in a magnetization hard-axis direction of the magnetoresistive element MTJ, and the bit line BLd extends in a magnetization easy-axis direction of the magnetoresistive element MTJ. However, the opposite is true.

The two bit lines BLu and BLd may be arranged in parallel with each other.

A spin-injection current (pulse current) Is for generating the spin-injection magnetization reversal is supplied to the magnetoresistive element MTJ during the data writing.

For example, when the spin-injection current Is is supplied from bit line BLu toward the bit line BLd, the magnetization direction of the recording layer is directed to the same direction as that of the fixed layer (pinned layer) (parallel state). When the spin-injection current Is is supplied from bit line BLd toward the bit line BLu, the magnetization direction of the recording layer is directed to the opposite direction to that of the fixed layer (anti-parallel state).

At this point, in the embodiment, a writing word line WWL extending in the magnetization hard-axis direction is arranged near the magnetoresistive element MTJ.

An assist current (pulse current) Ia is passed through the writing word line WWL during the data writing, and the assist current (pulse current) Ia has the direction according to a value of the writing data. The assist current Ia generates an assist magnetic field H in the magnetization easy-axis direction, in which the assist magnetic field H suppresses the electron spin thermal disturbance in the recording layer of the magnetoresistive element MTJ.

Figure 3:
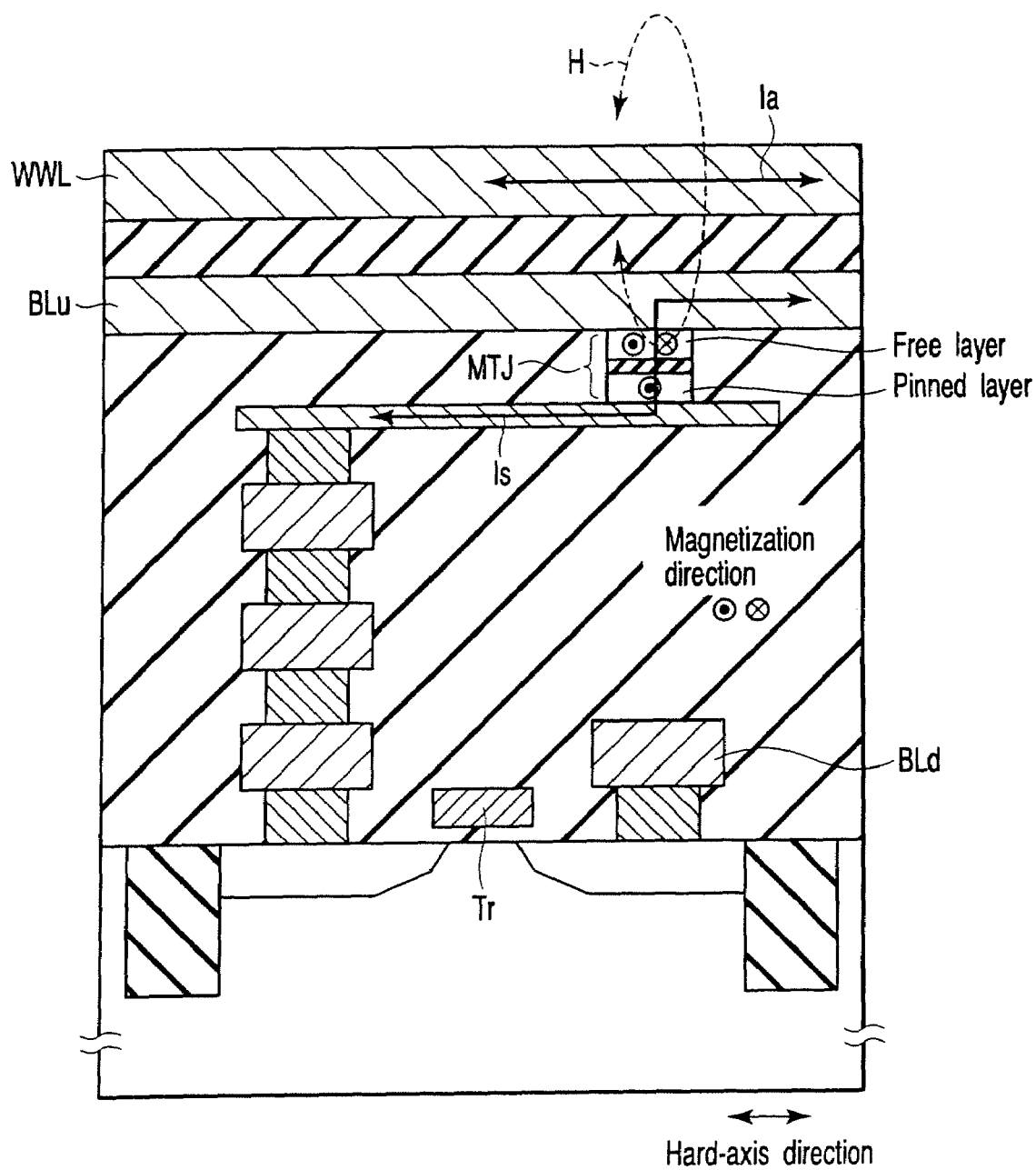
FIG. 3 is a sectional view showing a first embodiment of a structure.
Figure 4:
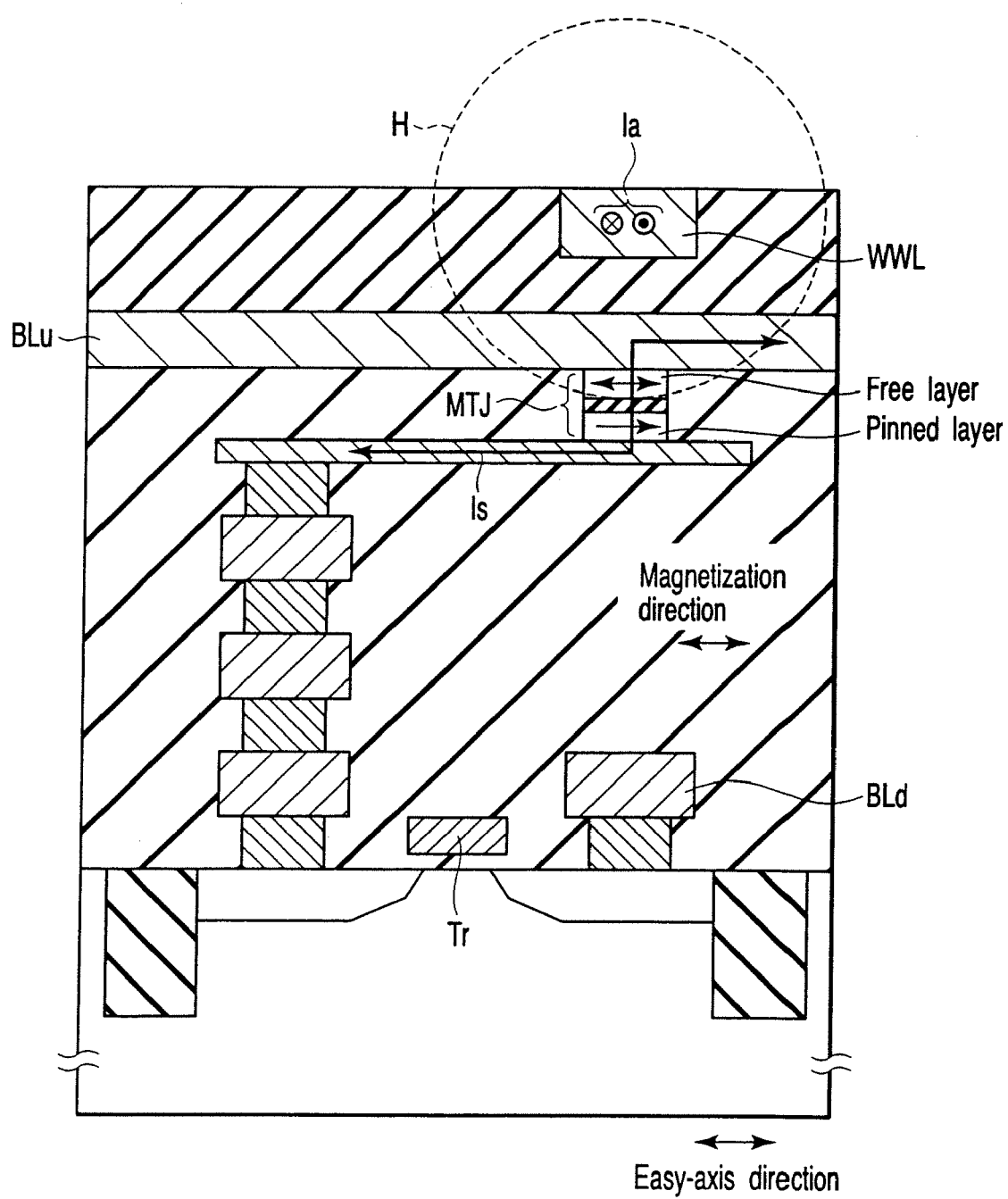
FIG. 4 is a sectional view showing the first embodiment of the structure.

Referring to FIG. 3, the writing word line WWL is arranged above the magnetoresistive element MTJ, and the writing word line WWL extends in the same direction as the bit line BLu. Referring to FIG. 4, the writing word line WWL is arranged above the magnetoresistive element MTJ, and the writing word line WWL extends in the direction intersecting the bit line BLu.

Figure 5:
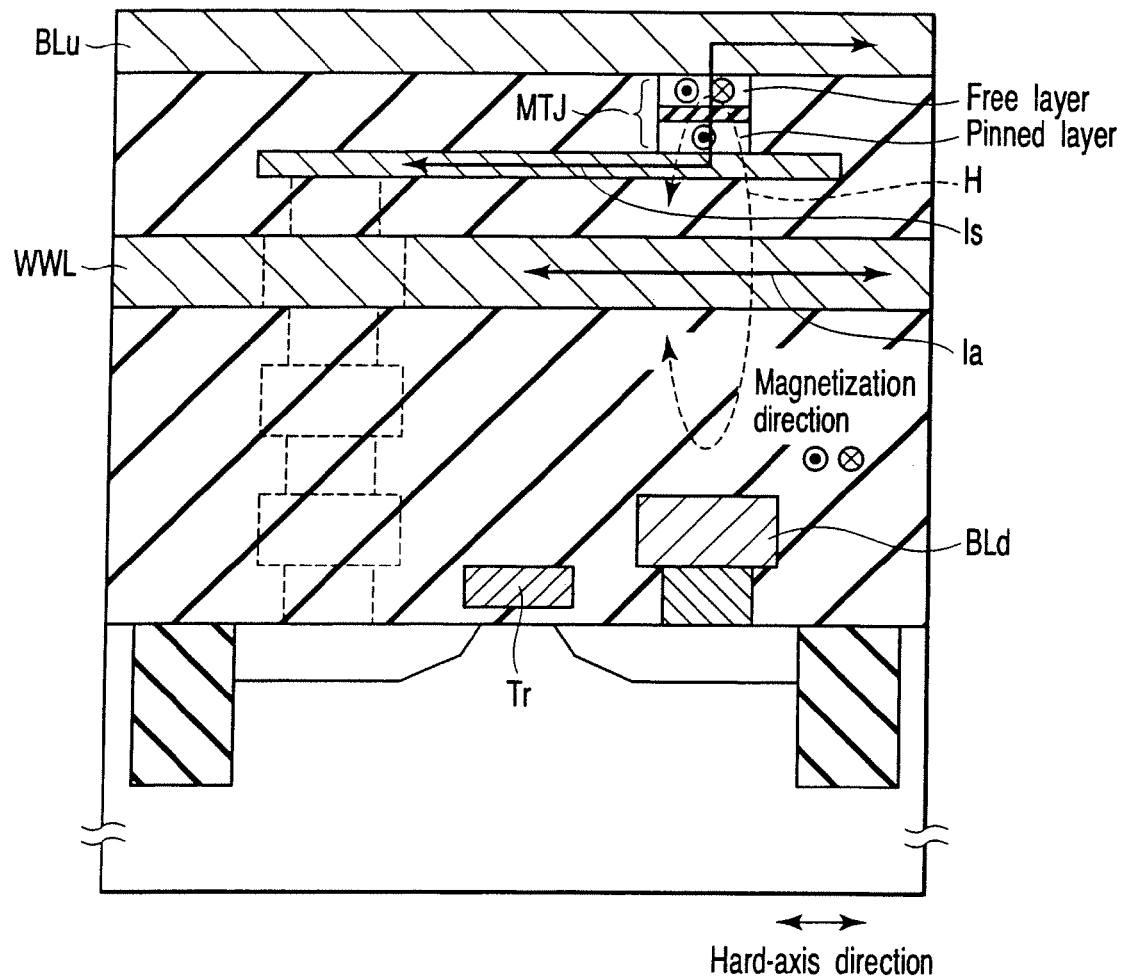
FIG. 5 is a sectional view showing the first embodiment of the structure.
Figure 6:
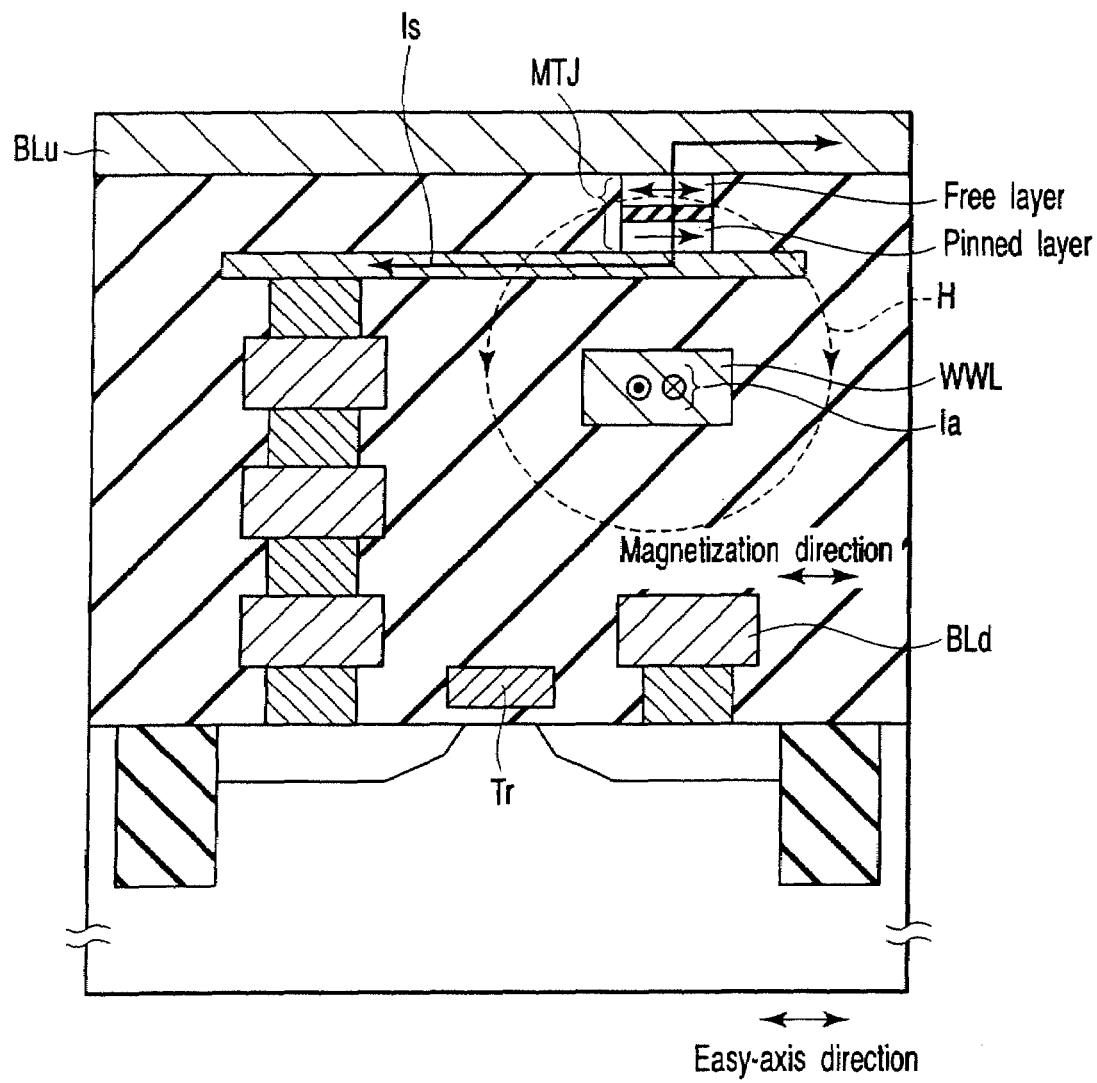
FIG. 6 is a sectional view showing the first embodiment of the structure.

Referring to FIG. 5, the writing word line WWL is arranged below the magnetoresistive element MTJ, and the writing word line WWL extends in the same direction as the bit line BLu. Referring to FIG. 6, the writing word line WWL is arranged below the magnetoresistive element MTJ, and the writing word line WWL extends in the direction intersecting the bit line BLu.

As described above, the temperature of the magnetoresistive element MTJ is held at a high level for tens nanoseconds even after the spin-injection current Is is cut off. Because the assist magnetic field H is used in order to suppress the electron spin thermal disturbance in the recording layer, the passage of the assist current Ia is continued for tens nanoseconds after the spin-injection current Is is cut off.

Timing in which the assist current Ia is passed may be set at the same timing in which the spin-injection current Is is passed, or the timing in which the assist current Ia is passed may be earlier or later than the timing in which the spin-injection current Is is passed.

(ii) Second Embodiment

FIGS. 7 to 10 show a second embodiment of the structure.

As with the first embodiment, the memory cell includes one MOS transistor Tr and one magnetoresistive element MTJ.

The second embodiment differs from the first embodiment in that the magnetoresistive element MTJ is an edge type tunnel magnetoresistive element.

While the tunnel barrier layer is formed on the upper surface of the fixed layer as shown in FIGS. 3 to 7 in the normal magnetoresistive element, the tunnel barrier layer is formed on a side face (board line portion) of the fixed layer in the edge type tunnel magnetoresistive element. Therefore, a junction area between the fixed layer and the tunnel barrier layer can be determined by the thickness of the fixed layer, which allows the fluctuation in characteristics among the elements to be decreased.

As with the first embodiment, the spin-injection current Is for generating the spin-injection magnetization reversal is supplied to the magnetoresistive element MTJ during the data writing.

For example, when the spin-injection current Is is supplied from bit line BLu toward the bit line BLd, the magnetization direction of the recording layer is directed to the same direction as that of the fixed layer (parallel state). When the spin-injection current Is is supplied from bit line BLd toward the bit line BLu, the magnetization direction of the recording layer is directed to the opposite direction to that of the fixed layer (anti-parallel state).

An assist current Ia is passed through the writing word line WWL during the data writing and the assist current (pulse current) Ia has the direction according to a value of the writing data. The assist current Ia generates the assist magnetic field H in the magnetization easy-axis direction and the assist magnetic field H suppresses the electron spin thermal disturbance in the recording layer of the magnetoresistive element MTJ.

Figure 7:
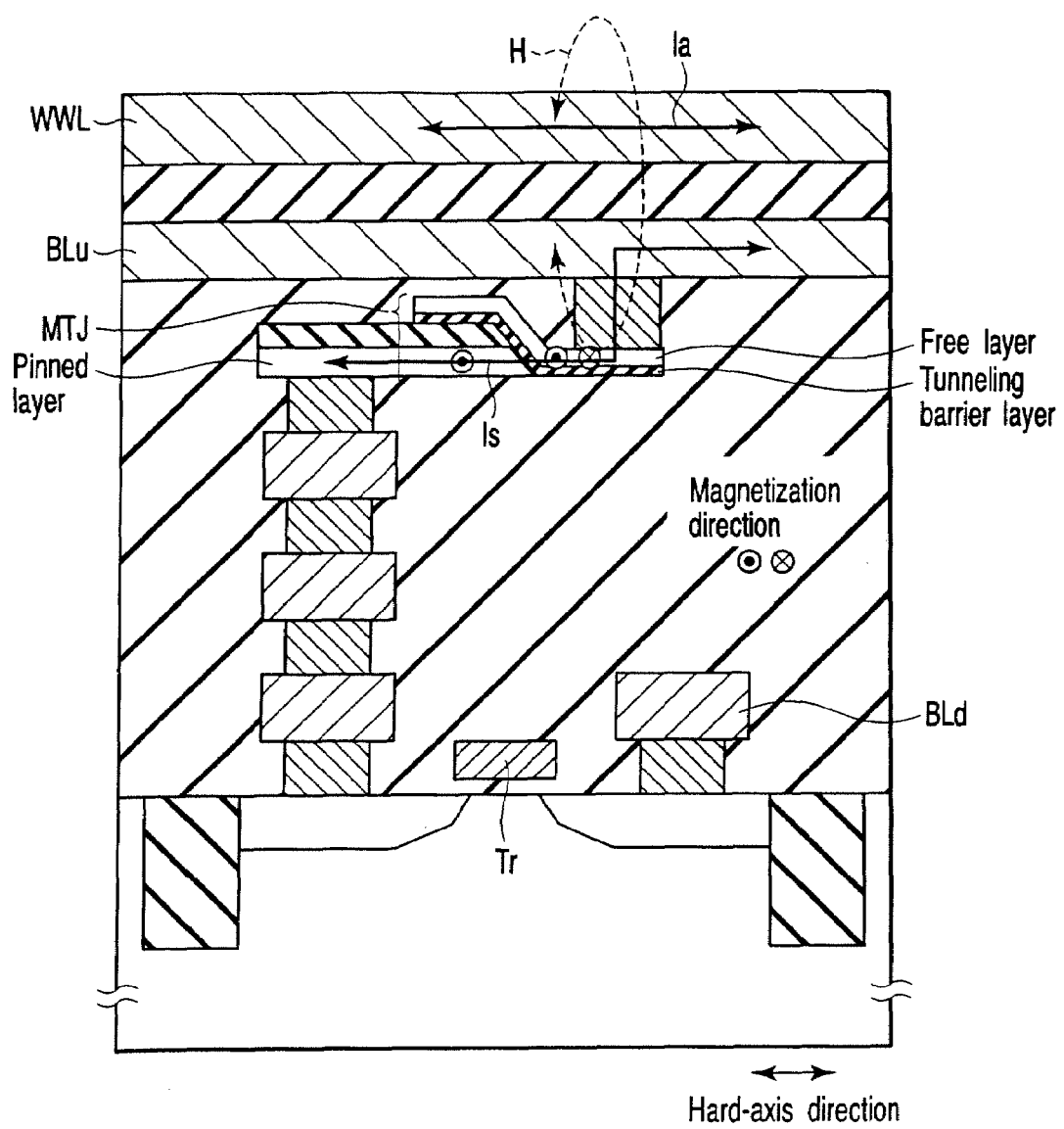
FIG. 7 is a sectional view showing a second embodiment of the structure.
Figure 8:
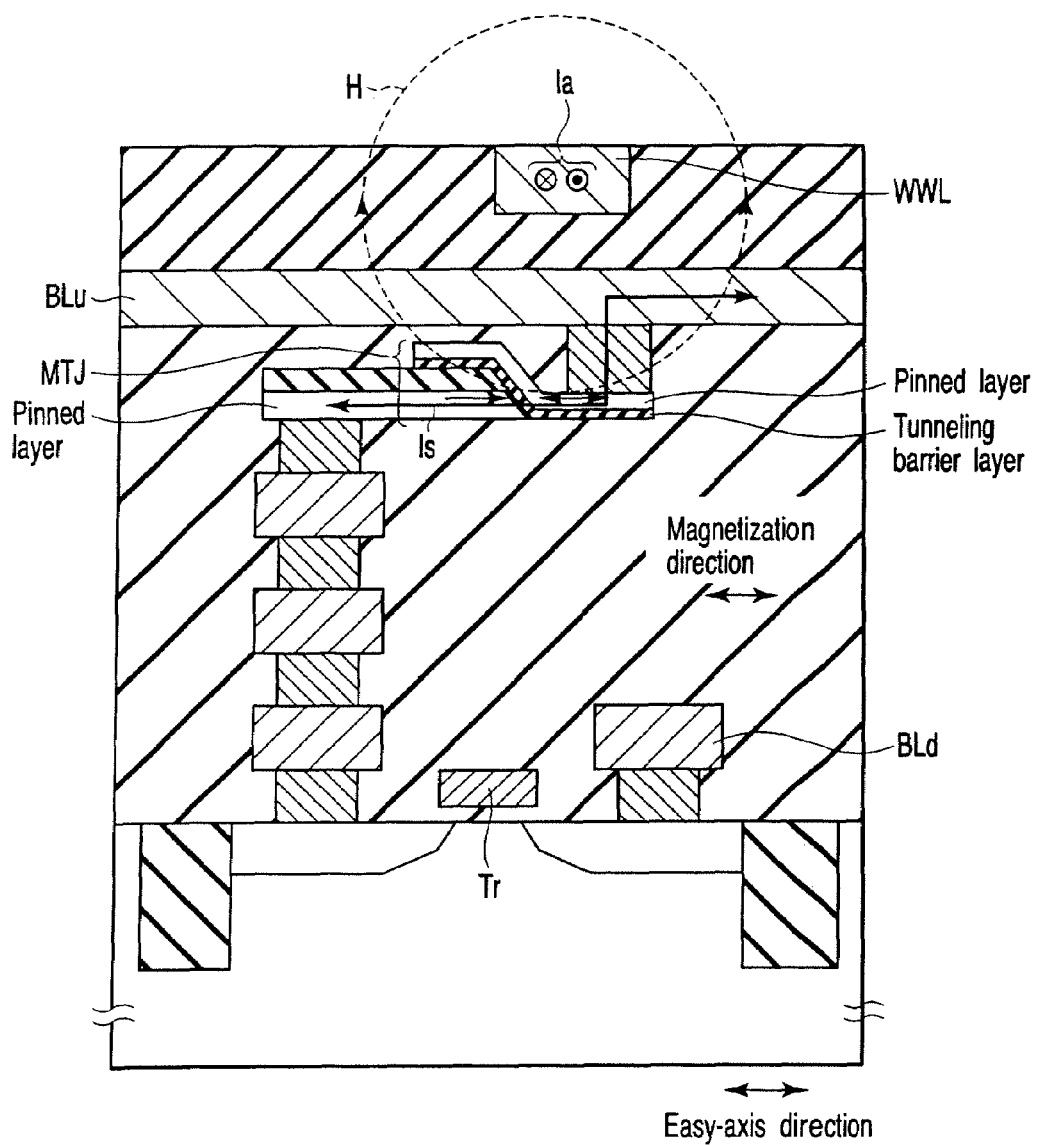
FIG. 8 is a sectional view showing the second embodiment of the structure.

Referring to FIG. 7, the writing word line WWL is arranged above the magnetoresistive element MTJ, and the writing word line WWL extends in the same direction as the bit line BLu. Referring to FIG. 8, the writing word line WWL is arranged above the magnetoresistive element MTJ, and the writing word line WWL extends in the direction intersecting the bit line BLu.

Figure 9:
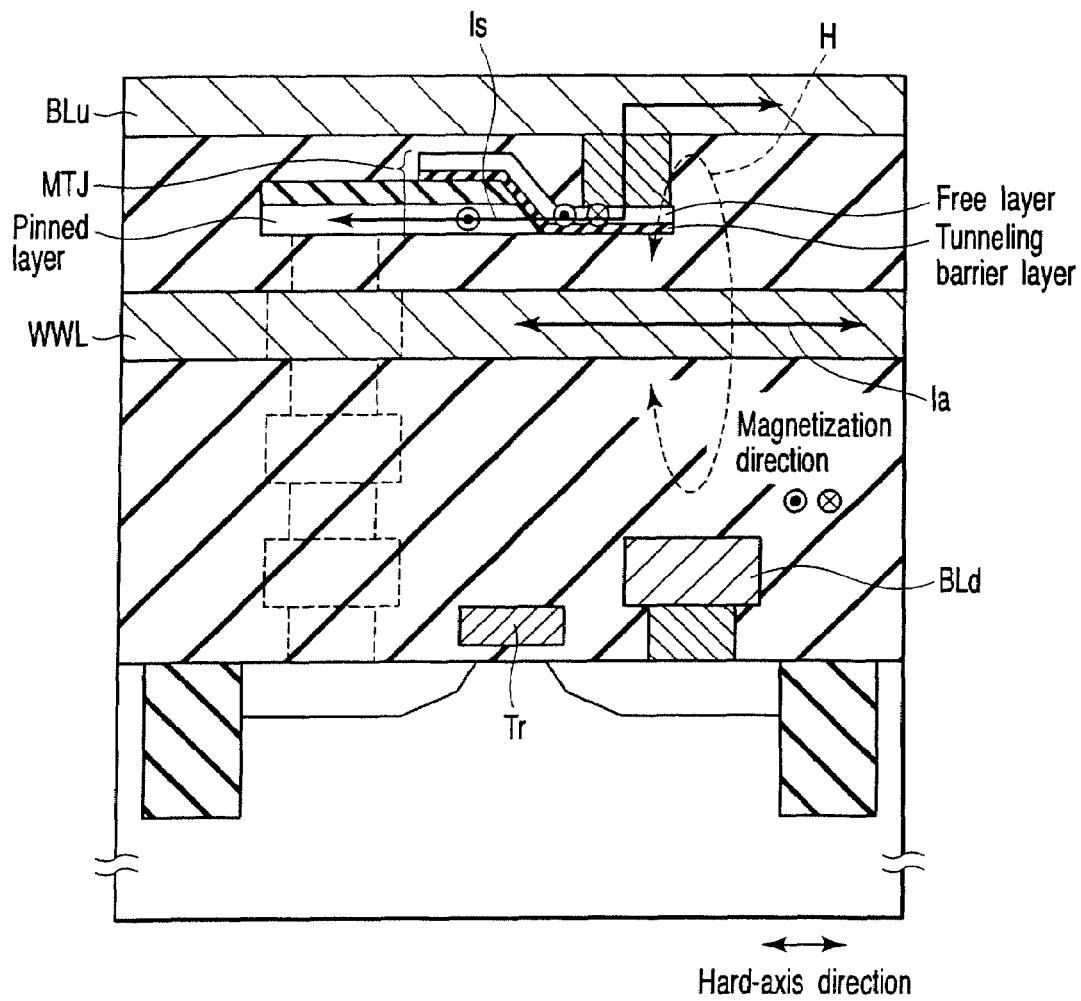
FIG. 9 is a sectional view showing the second embodiment of the structure.
Figure 10:
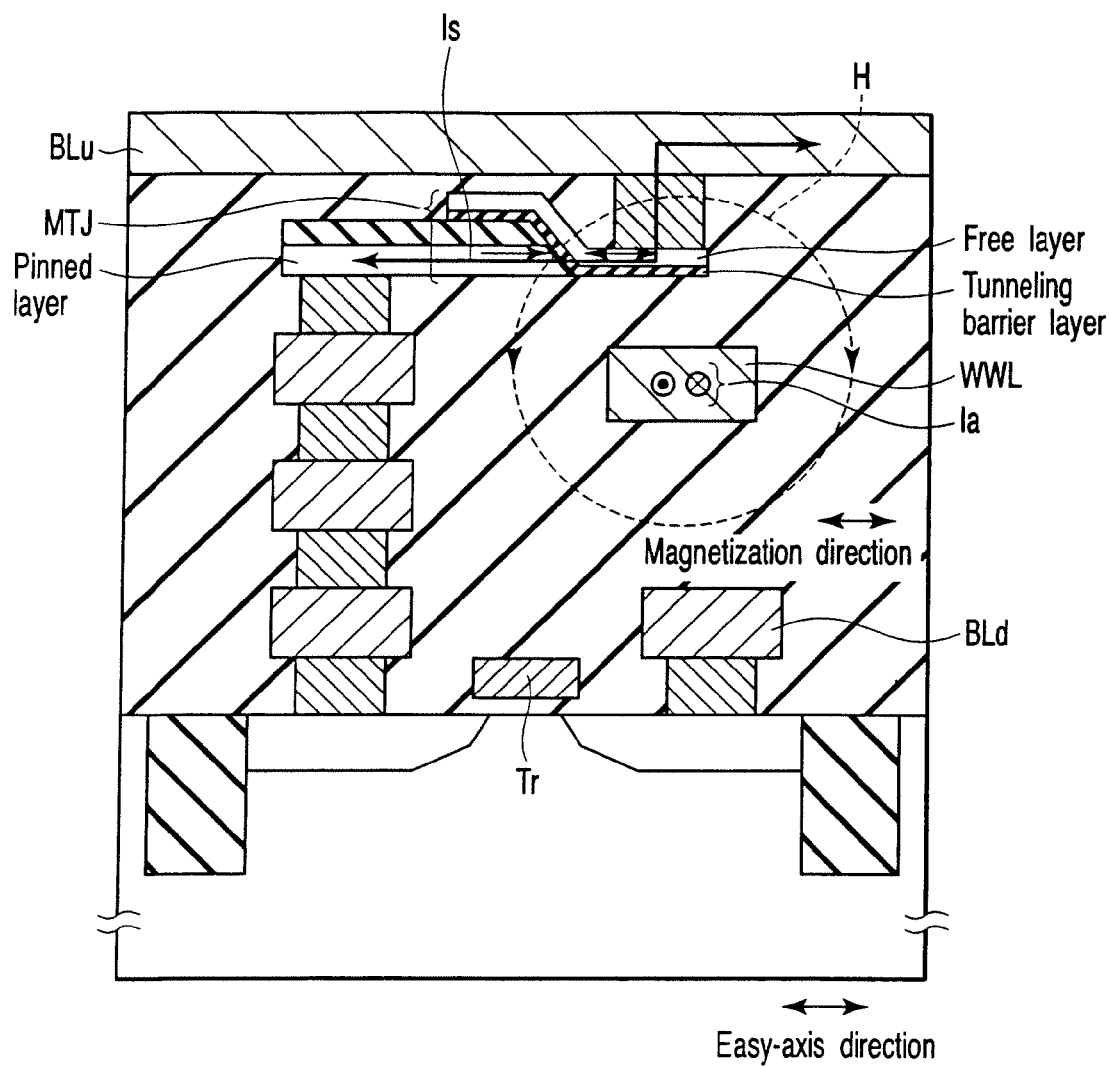
FIG. 10 is a sectional view showing the second embodiment of the structure.

Referring to FIG. 9, the writing word line WWL is arranged below the magnetoresistive element MTJ, and the writing word line WWL extends in the same direction as the bit line BLu. Referring to FIG. 10, the writing word line WWL is arranged below the magnetoresistive element MTJ, and the writing word line WWL extends in the direction intersecting the bit line BLu.

As with the first embodiment, the timing in which the assist current Ia is passed may be set at the same timing in which the spin-injection current Is is passed, or the timing in which the assist current Ia is passed may be earlier or later than the timing in which the spin-injection current Is is passed.

As with the first embodiment, the timing in which the assist current Ia is cut off is set at the time when tens nanoseconds elapses since the spin-injection current Is is cut off.

(3) Structure of Magnetoresistive Element

In order to realize the large-capacity spin-injection magnetic random access memory by solving the problems such as the tunnel barrier breakage and the thermal disturbance by the temperature rise of the magnetoresistive element, it is necessary that the structure of the magnetoresistive element is also studied.

It is necessary that the magnetoresistive element can be provided for the spin-injection magnetization reversal and can perform the magnetization reversal at low current density. Some embodiments for it will be described below.

(i) First Embodiment

Figure 11:
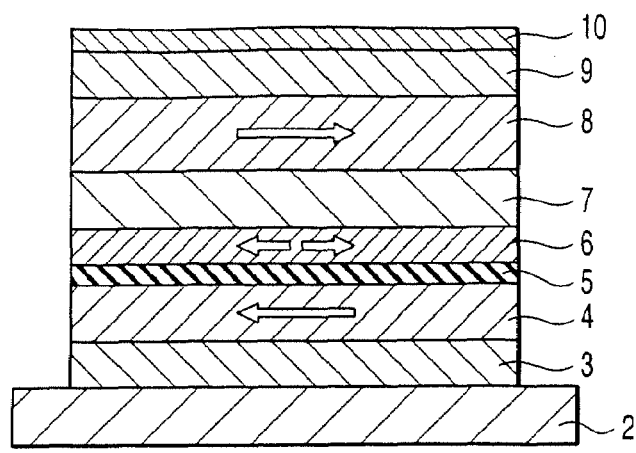
FIG. 11 is a sectional view showing a first embodiment of a magnetoresistive element.

FIG. 11 shows a first embodiment of the magnetoresistive element.

In the first embodiment, the magnetoresistive element includes an anti-ferromagnetic layer 3, a first magnetic fixed layer 4, a tunnel barrier layer 5, a magnetic recording layer 6, a non-magnetic metal layer 7, a second magnetic fixed layer 8, and an anti-ferromagnetic layer 9. The magnetic recording layer 6 is arranged on the first magnetic fixed layer 4 through tunnel barrier layer 5. The second magnetic fixed layer 8 is arranged on the magnetic recording layer 6 through the non-magnetic metal layer 7.

In the first magnetic fixed layer 4, the magnetization state is fixed by exchange interaction bonding between the first magnetic fixed layer 4 and the anti-ferromagnetic layer 3. In the second magnetic fixed layer 8, the magnetization state is fixed by the exchange interaction bonding between the second magnetic fixed layer 8 and the anti-ferromagnetic layer 9. The magnetization direction of the first magnetic fixed layer 4 is set in the opposite direction to the magnetization direction of the second magnetic fixed layer 8.

The magnetoresistive element is arranged on a ground layer 2 which is of an electrode, and an electrode layer 10 is arranged on the anti-ferromagnetic layer 9.

When the spin-injection current is passed from the electrode layer 10 to the ground layer 2, the spin-polarized electrons are injected from the first magnetic fixed layer 4 into the magnetic recording layer 6, and the magnetization direction of the magnetic recording layer 6 becomes a same direction of the first magnetic fixed layer 4 (parallel state). When the spin-injection current is passed from the ground layer 2 to the electrode layer 10, the spin-polarized electrons are injected from the second magnetic fixed layer 8 into the magnetic recording layer 6, and the magnetization direction of the magnetic recording layer 6 becomes in a same direction of the second magnetic fixed layer 8 (anti-parallel state).

In the spin-injection magnetization reversal method, in order to efficiently perform the magnetization reversal, the non-magnetic metal layer 7 and the second magnetic fixed layer 8 are formed by combination of materials in which spin reflectivity is enhanced.

For example, in the case where the second magnetic fixed layer 8 is made of the ferromagnetic material including Co (for example, Co rich), the non-magnetic metal layer 7 is made of at least one metal selected from the group of Zr, Hf, Rh, Ag, Cu, and Au, preferably from the group of Zr, Hf, Rh, and Ag or an alloy including at least one metal thereof.

Additionally, in the case where the second magnetic fixed layer 8 is made of the ferromagnetic material including Fe (for example, Fe rich), the non-magnetic metal layer 7 is made of at least one metal selected from the group of Rh, Pt, Ir, Al, Ga, Cu, and Au, preferably from the group of Rh, Pt, Ir, Al, and Ga or the alloy including at least one metal thereof.

In the case where the second magnetic fixed layer 8 is made of the ferromagnetic material including Ni (for example, Ni rich), the non-magnetic metal layer 7 is made of at least one metal selected from the group of Zr, Hf, Au, Ag, and Cu, preferably from the group of Zr, Hf, Au, and Ag or the alloy including at least one metal thereof.

According to the above structure, the second magnetic fixed layer 8 reflects the electron, which is spin-polarized in the opposite direction to the magnetization direction (direction of electron spin) of the second magnetic fixed layer 8. Therefore, the proper selection of the material for the non-magnetic metal layer 7 enables the efficient reflection of the electrons, spin-polarized in the opposite direction to the magnetization direction of the second magnetic fixed layer 8, to reverse the magnetization state of the magnetic recording layer 6.

It is necessary that the magnetic moment directions of the first magnetic fixed layer 4 and the second magnetic fixed layer 8 always differ from each other by about 180 degrees.

Therefore, for example, the anti-ferromagnetic layers 3 and 9 having different Neel temperatures $T_N$ may be added to the first magnetic fixed layer 4 and the second magnetic fixed layer 8 respectively, and the direction of the magnetic field can be reversed by 180 degrees when the temperature is between the Neel temperatures $T_N$ during the cooling in the annealing process of determining the magnetization direction.

(ii) Second Embodiment

Figure 12:
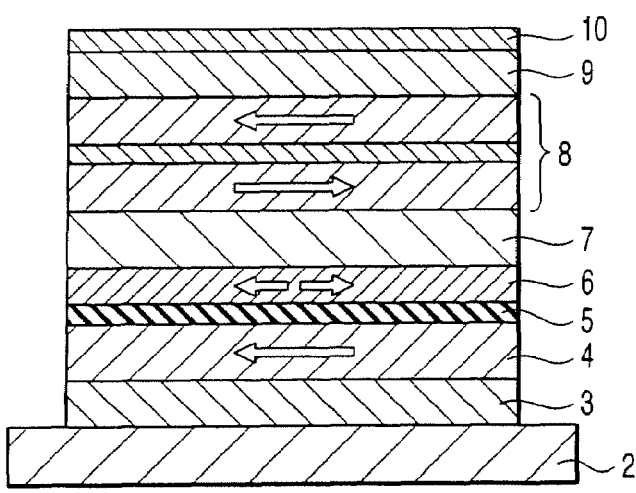
FIG. 12 is a sectional view showing a second embodiment of the magnetoresistive element.

FIG. 12 shows a second embodiment of the magnetoresistive element.

The second embodiment is one of modifications of the first embodiment, and the second embodiment differs from the first embodiment in the structure of the second magnetic fixed layer.

In the second embodiment, the magnetoresistive element includes the anti-ferromagnetic layer 3, the first magnetic fixed layer 4, the tunnel barrier layer 5, the magnetic recording layer 6, the non-magnetic metal layer 7, a second magnetic fixed layer 8SAF, and the anti-ferromagnetic layer 9. The magnetic recording layer 6 is arranged on the first magnetic fixed layer 4 through tunnel barrier layer 5. The second magnetic fixed layer 8SAF and the anti-ferromagnetic layer 9 are arranged on the magnetic recording layer 6 through the non-magnetic metal layer 7.

In the first magnetic fixed layer 4, the magnetization state is fixed by the exchange interaction bonding between the first magnetic fixed layer 4 and the anti-ferromagnetic layer 3. The second magnetic fixed layer 8SAF has an SAF (Synthetic Anti-ferromagnetic) structure, and the magnetization state of the second magnetic fixed layer 8SAF is fixed.

The adoption of the SAF structure can set the magnetization directions of the first magnetic fixed layer 4 and the ferromagnetic layer, located on the tunnel barrier layer 5 side of the second magnetic fixed layer 8SAF, at angles of 180 degrees in mutually opposite directions even without using the annealing process required for the structure of the first embodiment.

In the second embodiment, when the electrons are injected from the first magnetic fixed layer 4 to the magnetic recording layer 6 in reversing the magnetic moments (magnetization) between the first magnetic fixed layer 4 and the magnetic recording layer 6 from the anti-parallel state to the parallel state, the electrons spin-polarized in the first magnetic fixed layer 4 pass through the tunnel barrier layer 5 to impart spin torque to the magnetic recording layer 6.

The spin-polarized electrons reach the second magnetic fixed layer 8SAF from the magnetic recording layer 6 through the non-magnetic metal layer 7. However, the spin-polarized electrons are reflected on the second magnetic fixed layer 8SAF, and the spin-polarized electrons, which are of the reflected spin electrons impart the spin torque to the magnetic recording layer 6 again.

Accordingly, when the magnetic moments between the first magnetic fixed layer 4 and the magnetic recording layer 6 are in the anti-parallel state, the magnetic moment of the magnetic recording layer 6 is reversed, and the magnetic moments between the first magnetic fixed layer 4 and the magnetic recording layer 6 become in a parallel state.

When the electrons are injected from the second magnetic fixed layer 8SAF to the magnetic recording layer 6 in reversing the magnetic moments (magnetization) between the first magnetic fixed layer 4 and the magnetic recording layer 6 from the parallel state to the anti-parallel state, the electrons spin-polarized in the second magnetic fixed layer 8SAF pass through the non-magnetic metal layer 7 to impart the spin torque to the magnetic recording layer 6.

The spin-polarized electrons tend to flow from the magnetic recording layer 6 to the first magnetic fixed layer 4 through the tunnel barrier layer 5. However, because tunneling probability is lowered in the electrons having the spins in the opposite direction to the magnetic moment of the first magnetic fixed layer 4 when the electrons is passed through the tunnel barrier layer 5, the electrons are reflected, and the electrons which are of the reflected spin electrons impart the spin torque to the magnetic recording layer 6 again.

Accordingly, when the magnetic moments between the first magnetic fixed layer 4 and the magnetic recording layer 6 are in the parallel state, the magnetic moment of the magnetic recording layer 6 is reversed, and the magnetic moments between the first magnetic fixed layer 4 and the magnetic recording layer 6 become in an anti-parallel state.

Thus, the magnetization direction of the magnetic recording layer 6 can be reversed by changing the passage direction of the spin-injection current, so that the writing of "0" and "1" can be performed by the spin injection.

In the case where the second magnetic fixed layer 8SAF is made of the ferromagnetic material including Co (for example, Co rich), the non-magnetic metal layer 7 is made of at least one metal selected from the group of Zr, Hf, Rh, Ag, Cu, and Au, preferably from the group of Zr, Hf, Rh, and Ag or an alloy including at least one metal thereof.

In the case where the second magnetic fixed layer 8SAF is made of the ferromagnetic material including Fe (for example, Fe rich), the non-magnetic metal layer 7 is made of at least one metal selected from the group of Rh, Pt, Ir, Al, Ga, Cu, and Au, preferably from the group of Rh, Pt, Ir, Al, and Ga or the alloy including at least one metal thereof.

Furthermore, in the case where the second magnetic fixed layer 8SAF is made of the ferromagnetic material including Ni (for example, Ni rich), the non-magnetic metal layer 7 is made of at least one metal selected from the group of Zr, Hf, Au, Ag, and Cu, preferably from the group of Zr, Hf, Au, and Ag or the alloy including at least one metal thereof.

(iii) Third Embodiment

Figure 13:
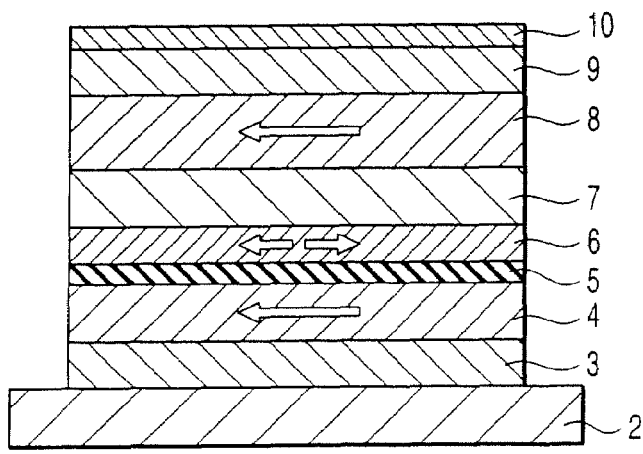
FIG. 13 is a sectional view showing a third embodiment of the magnetoresistive element.

FIG. 13 shows a third embodiment of the magnetoresistive element.

In the third embodiment, the magnetoresistive element includes the anti-ferromagnetic layer 3, the first magnetic fixed layer 4, the tunnel barrier layer 5, the magnetic recording layer 6, the non-magnetic metal layer 7, the second magnetic fixed layer 8, and the anti-ferromagnetic layer 9. The magnetic recording layer 6 is arranged on the first magnetic fixed layer 4 through tunnel barrier layer 5. The second magnetic fixed layer 8 is arranged on the magnetic recording layer 6 through the non-magnetic metal layer 7.

In the first magnetic fixed layer 4, the magnetization state is fixed by the exchange interaction bonding between the first magnetic fixed layer 4 and the anti-ferromagnetic layer 3. In the second magnetic fixed layer 8, the magnetization state is fixed by the exchange interaction bonding between the second magnetic fixed layer 8 and the anti-ferromagnetic layer 9. The magnetization direction of the first magnetic fixed layer 4 is set in the same direction as the magnetization direction of the second magnetic fixed layer 8.

The magnetoresistive element is arranged on the ground layer 2, and the electrode layer 10 is arranged on the anti-ferromagnetic layer 9.

In this configuration, when the spin-injection current is passed from the electrode layer 10 to the ground layer 2, the electrons are injected from the first magnetic fixed layer 4 into the magnetic recording layer 6, and the electrons spin-polarized in the same direction as the magnetic moment of the first magnetic fixed layer 4 in the first magnetic fixed layer 4 impart the spin torque to the magnetic recording layer 6 through the tunnel barrier layer 5 (parallel state). Further, the electrons are injected to the second magnetic fixed layer 8 through the magnetic recording layer 6 and the non-magnetic metal layer 7. When the material for the non-magnetic metal layer 7 is selected, the electrons having the spin in the same direction as the magnetic moment of the second magnetic fixed layer 8 are reflected on the second magnetic fixed layer 8 and injected again to the magnetic recording layer 6 as the reflected spin electron, which allows the magnetization direction of the magnetic recording layer 6 to be directed to the same direction as that of the first magnetic fixed layer 4 (parallel state).

When the spin-injection current is passed from the ground layer 2 to the electrode layer 10, the electrons are injected from the second magnetic fixed layer 8 into the magnetic recording layer 6 through the non-magnetic metal layer 7. When the material for the non magnetic metal layer 7 is selected, the electrons having the spin in the opposite direction to the magnetic moment of the second magnetic fixed layer 8 become dominant in passing the electrons spin-polarized in the second magnetic fixed layer 8 through the non-magnetic metal layer 7, and the spin-polarized electrons impart the spin torque to the magnetic recording layer 6. Further, the electrons tend to flow from the magnetic recording layer 6 to the first magnetic fixed layer 4 through the tunnel barrier layer 5. However, because the tunneling probability is lowered in the electrons having the spins in the opposite direction to the magnetic moment of the first magnetic fixed layer 4 when the electrons is passed through the tunnel barrier layer 5, the electrons are reflected, and the electrons which are of the reflected spin electrons impart the spin torque to the magnetic recording layer 6 again. Thereby, the magnetization direction of the magnetic recording layer 6 is directed to the opposite direction to that of the first magnetic fixed layer 4 (anti-parallel state).

In the spin-injection magnetization reversal method, in order to efficiently perform the magnetization reversal, the non-magnetic metal layer 7 and the second magnetic fixed layer 8 are formed by the combination of materials in which spin reflectivity is enhanced.

In the case where the second magnetic fixed layer 8 is made of the ferromagnetic material including Co (for example, Co rich), the non-magnetic metal layer 7 is made of at least one metal selected from the group of Cr, Ir, Os, Ru, and Re, preferably from the group of Cr, Ir, and Os or an alloy including at least one metal thereof.

In the case where the second magnetic fixed layer 8 is made of the ferromagnetic material including Fe (for example, Fe rich), the non-magnetic metal layer 7 is made of at least one metal selected from the group of Mn, Cr, V, Mo, Re, Ru, Os, W, and Ti, preferably from the group of Mn, Cr, V, Mo, and Re or the alloy including at least one metal thereof.

In the case where the second magnetic fixed layer 8 is made of the ferromagnetic material including Ni (for example, Ni rich), the non-magnetic metal layer 7 is made of at least one metal selected from the group of Rh, Ru, Ir, Os, Cr, Re, W, Nb, V, Ta, and Mo, preferably from the group of Rh, Ru, Ir, and Os or the alloy including at least one metal thereof.

According to the above structure, the second magnetic fixed layer 8 reflects the electron, which is spin-polarized in the opposite direction to the magnetization direction (direction of electron spin) of the second magnetic fixed layer 8. Therefore, the proper selection of the material for the non-magnetic metal layer 7 enables the efficient reflection of the electrons, spin-polarized in the opposite direction to the magnetization direction of the second magnetic fixed layer 8, to reverse the magnetization state of the magnetic recording layer 6.

In the third embodiment, the annealing process of the first embodiment is not required because the magnetic moment directions of the first magnetic fixed layer 4 and the second magnetic fixed layer 8 are directed to the same direction.

(iv) Fourth Embodiment

Figure 14:
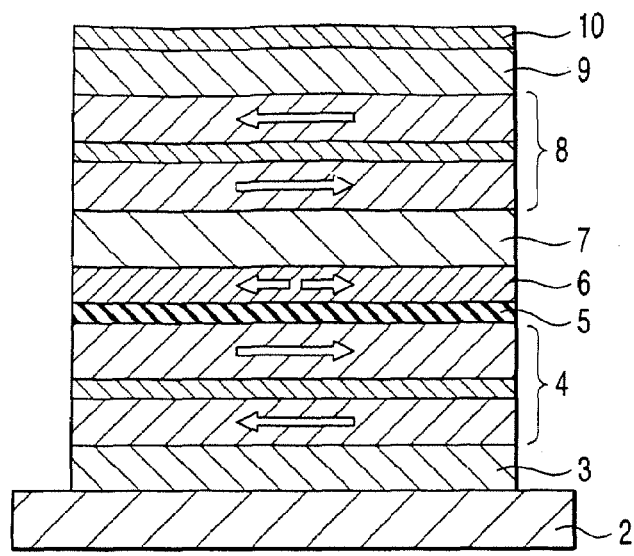
FIG. 14 is a sectional view showing a fourth embodiment of the magnetoresistive element.

FIG. 14 shows a fourth embodiment of the magnetoresistive element.

The fourth embodiment is one of modifications of the third embodiment, and the fourth embodiment differs from the third embodiment in that the first and second magnetic fixed layers have the SAF (Synthetic anti-ferromagnetic) structures respectively.

In the fourth embodiment, the magnetoresistive element includes the anti-ferromagnetic layer 3, a first magnetic fixed layer 4SAF, the tunnel barrier layer 5, the magnetic recording layer 6, the non-magnetic metal layer 7, the second magnetic fixed layer 8SAF, and the anti-ferromagnetic layer 9. The magnetic recording layer 6 is arranged on the first magnetic fixed layer 4SAF through tunnel barrier layer 5. The second magnetic fixed layer 8SAF is arranged on the magnetic recording layer 6 through the non-magnetic metal layer 7.

The first magnetic fixed layer 4SAF has the SAF structure, and the magnetization state of the first magnetic fixed layer 4SAF is fixed. Similarly the second magnetic fixed layer 8SAF has the SAF structure, and the magnetization state of the second magnetic fixed layer 8SAF is fixed.

In the fourth embodiment, the writing can be performed in the manner similar to the third embodiment.

That is, when the electrons are injected from the first magnetic fixed layer 4 to the magnetic recording layer 6 in reversing the magnetic moments (magnetization) between the first magnetic fixed layer 4SAF and the magnetic recording layer 6 from the anti-parallel state to the parallel state, the electrons spin-polarized in the first magnetic fixed layer 4SAF pass through the tunnel barrier layer 5 to impart the spin torque to the magnetic recording layer 6.

The spin-polarized electrons reach the second magnetic fixed layer 8SAF from the magnetic recording layer 6 through the non-magnetic metal layer 7. However, the spin-polarized electrons are reflected on the second magnetic fixed layer 8SAF, and the spin-polarized electrons, which are of the reflected spin electrons, impart the spin torque to the magnetic recording layer 6 again.

Accordingly, when the magnetic moments between the first magnetic fixed layer 4SAF and the magnetic recording layer 6 are in the anti-parallel state, the magnetic moment of the magnetic recording layer 6 is reversed, and the magnetic moments between the first magnetic fixed layer 4SAF and the magnetic recording layer 6 become in the parallel state.

When the electrons are injected from the second magnetic fixed layer 8SAF to the magnetic recording layer 6 in reversing the magnetic moments (magnetization) between the first magnetic fixed layer 4SAF and the magnetic recording layer 6 from the parallel state to the anti-parallel state, the electrons spin-polarized in the second magnetic fixed layer 8SAF pass through the non-magnetic metal layer 7 to impart the spin torque to the magnetic recording layer 6.

The spin-polarized electrons tend to flow from the magnetic recording layer 6 to the first magnetic fixed layer 4SAF through the tunnel barrier layer 5. However, because the tunneling probability is lowered in the electrons having the spins in the opposite direction to the magnetic moment of the first magnetic fixed layer 4SAF when the electrons is passed through the tunnel barrier layer 5, the electrons are reflected, and the electrons which are of the reflected spin electrons impart the spin torque to the magnetic recording layer 6 again.

Accordingly, when the magnetic moments between the first magnetic fixed layer 4SAF and the magnetic recording layer 6 are in the parallel state, the magnetic moment of the magnetic recording layer 6 is reversed, and the magnetic moments between the first magnetic fixed layer 4 and the magnetic recording layer 6 become in the anti-parallel state.

Thus, the magnetization reversal can be performed by changing the direction in which the spin-injection current is passed with respect to the magnetoresistive element, so that the writing of "0" and "1" can be performed by the spin injection.

In the case where the first and second magnetic fixed layers 4SAF and 8SAF are made of the ferromagnetic material including Co (for example, Co rich), the non-magnetic metal layer 7 is made of at least one metal selected from the group of Cr, Ir, Os, Ru, and Re, preferably from the group of Cr, Ir, and Os or an alloy including at least one metal thereof.

In the case where the first and second magnetic fixed layers 4SAF and 8SAF are made of the ferromagnetic material including Fe (for example, Fe rich), the non-magnetic metal layer 7 is made of at least one metal selected from the group of Mn, Cr, V, Mo, Re, Ru, Os, W, and Ti, preferably from the group of Mn, Cr, V, Mo, and Re or the alloy including at least one metal thereof.

In the case where the first and second magnetic fixed layers 4SAF and 8SAF are made of the ferromagnetic material including Ni (for example, Ni rich), the non-magnetic metal layer 7 is made of at least one metal selected from the group of Rh, Ru, Ir, Os, Cr, Re, W, Nb, V, Ta, and Mo, preferably from the group of Rh, Ru, Ir, and Os or the alloy including at least one metal thereof.

(v) Fifth Embodiment

FIGS. 15 to 18 show a fifth embodiment of the magnetoresistive element.

The fifth embodiment is one of improvements of the first to fourth embodiments, and the fifth embodiment has the characteristic in that the magnetic recording layer is formed by plural array-shaped columnar layers when compared with the first to fourth embodiments.

Figure 15:
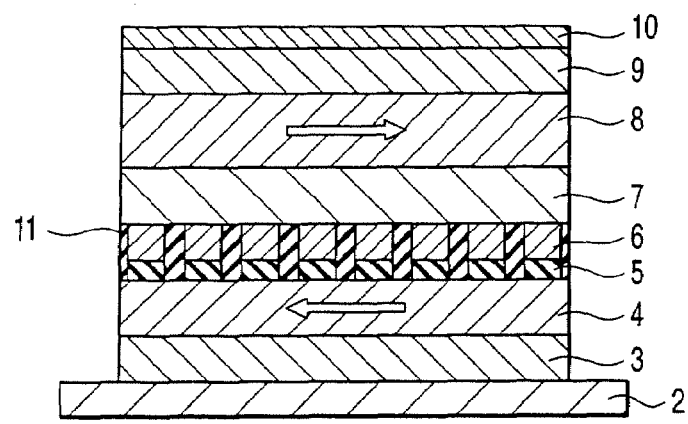
FIG. 15 is a sectional view showing a fifth embodiment of the magnetoresistive element.
Figure 16:
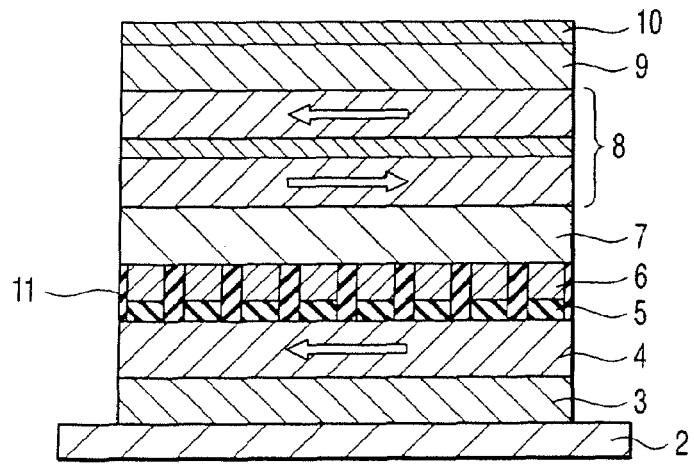
FIG. 16 is a sectional view showing the fifth embodiment of the magnetoresistive element.
Figure 17:
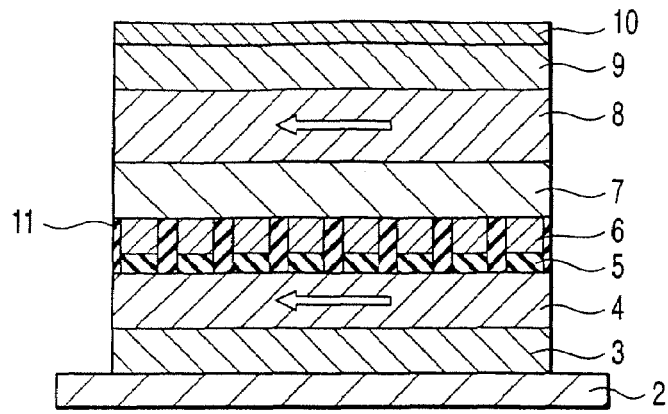
FIG. 17 is a sectional view showing the fifth embodiment of the magnetoresistive element.
Figure 18:
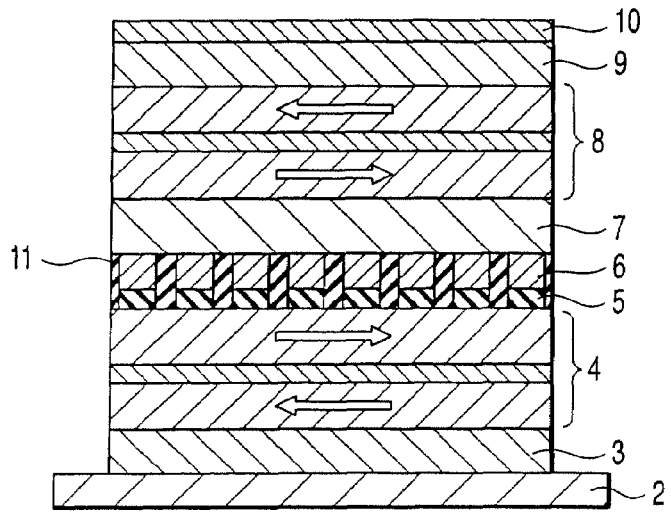
FIG. 18 is a sectional view showing the fifth embodiment of the magnetoresistive element.

FIG. 15 is an improvement of the first embodiment shown in FIG. 11, FIG. 16 is an improvement of the second embodiment shown in FIG. 12, FIG. 17 is an improvement of the third embodiment shown in FIG. 13, and FIG. 18 is an improvement of the fourth embodiment shown in FIG. 14.

The magnetic recording layer 6 is formed by a set of the plural array-shaped columnar layers (ferromagnetic body). The magnetization direction can be changed in each of the columnar layers. The columnar layers are separated by insulating bodies (or dielectric bodies) 11. The tunnel barrier layer 5 is arranged between the first magnetic fixed layer 4 or 4SAF and the magnetic recording layer 6.

In the case of the structures shown in FIGS. 15 and 16, the non-magnetic metal layer 7 and the second magnetic fixed layer 8 or 8SAF are formed by the combination of the following materials in order to enhance the spin reflectivity.

Additionally, in the case where the second magnetic fixed layer 8 or 8SAF is made of the ferromagnetic material including Co (for example, Co rich), the non-magnetic metal layer 7 is made of at least one metal selected from the group of Zr, Hf, Rh, Ag, Cu, and Au, preferably from the group of Zr, Hf, Rh, and Ag or an alloy including at least one metal thereof.

In the case where the second magnetic fixed layer 8 or 8SAF is made of the ferromagnetic material including Fe (for example, Fe rich), the non-magnetic metal layer 7 is made of at least one metal selected from the group of Rh, Pt, Ir, Al, Ga, Cu, and Au, preferably from the group of Rh, Pt, Ir, Al, and Ga or the alloy including at least one metal thereof.

In the case where the second magnetic fixed layer 8 or 8SAF is made of the ferromagnetic material including Ni (for example, Ni rich), the non-magnetic metal layer 7 is made of at least one metal selected from the group of Zr, Hf, Au, Ag, and Cu, preferably from the group of Zr, Hf, Au, and Ag or the alloy including at least one metal thereof.

In the case of the structures shown in FIGS. 17 and 18, the non-magnetic metal layer 7 and the second magnetic fixed layer 8 or 8SAF are formed by the combination of the following materials in order to enhance the spin reflectivity.

In the case where the second magnetic fixed layer 8 or 8SAF is made of the ferromagnetic material including Co (for example, Co rich), the non-magnetic metal layer 7 is made of at least one metal selected from the group of Cr, Ir, Os, Ru, and Re, preferably from the group of Cr, Ir, and Os or an alloy including at least one metal thereof.

In the case where the second magnetic fixed layer 8 or 8SAF is made of the ferromagnetic material including Fe (for example, Fe rich), the non-magnetic metal layer 7 is made of at least one metal selected from the group of Mn, Cr, V, Mo, Re, Ru, Os, W, and Ti, preferably from the group of Mn, Cr, V, Mo, and Re or the alloy including at least one metal thereof.

In the case where the second magnetic fixed layer 8 or 8SAF is made of the ferromagnetic material including Ni (for example, Ni rich), the non-magnetic metal layer 7 is made of at least one metal selected from the group of Rh, Ru, Ir, Os, Cr, Re, W, Nb, V, Ta, and Mo, preferably from the group of Rh, Ru, Ir, and Os or the alloy including at least one metal thereof.

Thus, according to the magnetoresistive element having the magnetic recording layer 6 formed by the plural columnar layers, an effective junction area of the ferromagnetic tunnel junction is decreased when compared with the first to fourth embodiments. Thereby, even if the spin-injection current is passed during the data writing, the ring magnetic field caused by the spin-injection current is hardly generated, which allows the magnetization reversal to be stably performed in the magnetic recording layer.

The fifth embodiment is effective when the dimensions of the magnetoresistive element are relatively large. Specifically, when the columnar layer is formed by cylinders, it is preferable that a diameter of the columnar layer is set in the range of 1 to 100 nm.

When the diameter of the columnar layer is lower than 1 nm, the ferromagnetic body of the columnar structure becomes superparamagnetism. When the diameter of the columnar layer is more than 100 nm, the stable magnetization reversal is hardly performed due to stabilization of a circulating magnetic domain structure and the MR ratio is also decreased.

(vi) Summary

As described above, in the spin-injection writing method, when the magnetic recording layer 6 contains Ni—Co, Ni—Fe, Co—Fe, or Co—Fe—Ni, the non-magnetic metal layer 7 is made of at least one metal selected from the group of Au, Zr, Hf, Rh, Pt, Ir, Al, and Ga or the alloy including at least one metal thereof. Therefore, the spin-injection current Is can be decreased.

When the magnetoresistive elements of the first to fifth embodiments are used as the memory cells of the spin-injection magnetic random access memory shown in FIGS. 3 to 10, the current density is decreased during the magnetization reversal, which allows the problems such as the tunnel barrier layer breakage and the thermal disturbance to be solved. In this case, in order to stabilize the magnetization states of the first and second magnetic fixed layers 4 or 4SAF and 8 or 8SAF during the magnetization reversal, the volumes of the first and second magnetic fixed layers 4 or 4SAF and 8 or 8SAF are enlarged as much as possible.

With reference to the SAF structure, the SAF structure can be applied to one of or both the first and second magnetic fixed layers.

(4) Writing Method

The data writing method (magnetization reversal process) with the architectures according to the embodiments of the invention will be described below.

Figure 19:
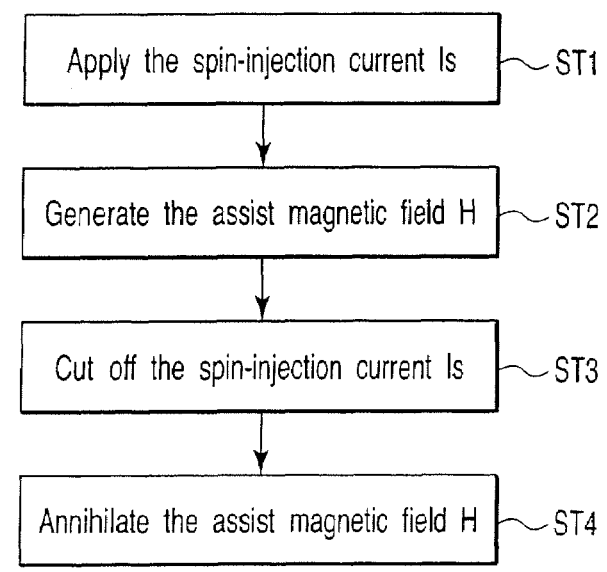
FIG. 19 shows a flowchart of a writing method according to Example of the invention.
Figure 20:
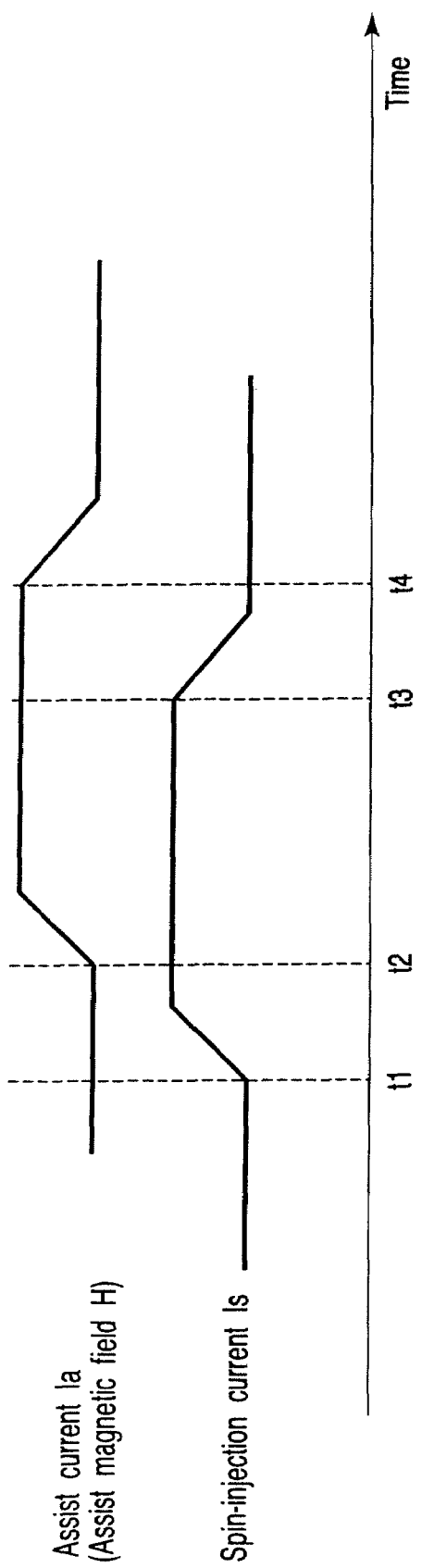
FIG. 20 is a waveform chart showing on/off timing of a spin-injection current and an assist magnetic field.

FIG. 19 shows a flowchart of the magnetization reversal process according to the embodiments of the invention. FIG. 20 shows signal waveforms of spin-injection current and the assist magnetic field (assist current) for realizing the process of FIG. 19.

First the spin-injection current Is having the direction according to the value of writing data is provided to the magnetoresistive element (STEP ST1, time t1). The electrons spin-polarized by the spin-injection current Is are generated, and the spin torque acts on the magnetic recording layer by the spin-polarized electrons to start the magnetization reversal.

When the spin-injection current Is is passed through the magnetoresistive element, since the temperature of the magnetoresistive element rises gradually (see FIG. 2), at the same timing in which the spin-injection current Ia is passes, or after the spin-injection current Ia is passes, the assist current Is is passed through the writing word line WWL to generate the assist magnetic field H (STEP ST2, time t2).

The assist magnetic field H is generated in the magnetization easy-axis direction of the magnetoresistive element, which suppresses the electron spin thermal disturbance in the magnetic free layer, caused by the temperature rise of the magnetoresistive element.

The timing in which the assist current Ia is passed through the word line WWL to generate the assist magnetic field H may be earlier than the timing of the passage of the spin-injection current Ia.

Then, the spin-injection current Is is cut off (STEP ST3, time t3).

In this case, as can be seen from FIG. 2, the magnetoresistive element has the high temperature enough to generate the electron spin thermal disturbance until tens nanoseconds elapse since the spin-injection current Is is cut off.

Therefore, until tens nanoseconds elapse, the assist current Ia is continuously provided even after the spin-injection current Is is cut off.

After the temperature of the magnetoresistive element sufficiently falls down, the assist current Ia is stopped to cut off the assist magnetic field H (STEP ST4, time t4).

Thus, according to the magnetization reversal process of the embodiments of the invention, in the current cutoff timing, since the pulse current for generating the assist magnetic field is later than the pulse current for spin-injection writing, the electron spin thermal disturbance in the magnetic recording layer caused by the temperature rise of the magnetoresistive element can effectively be prevented.

2. EXAMPLES

Then, preferred example will be described.

(1) Circuit Example

Figure 21:
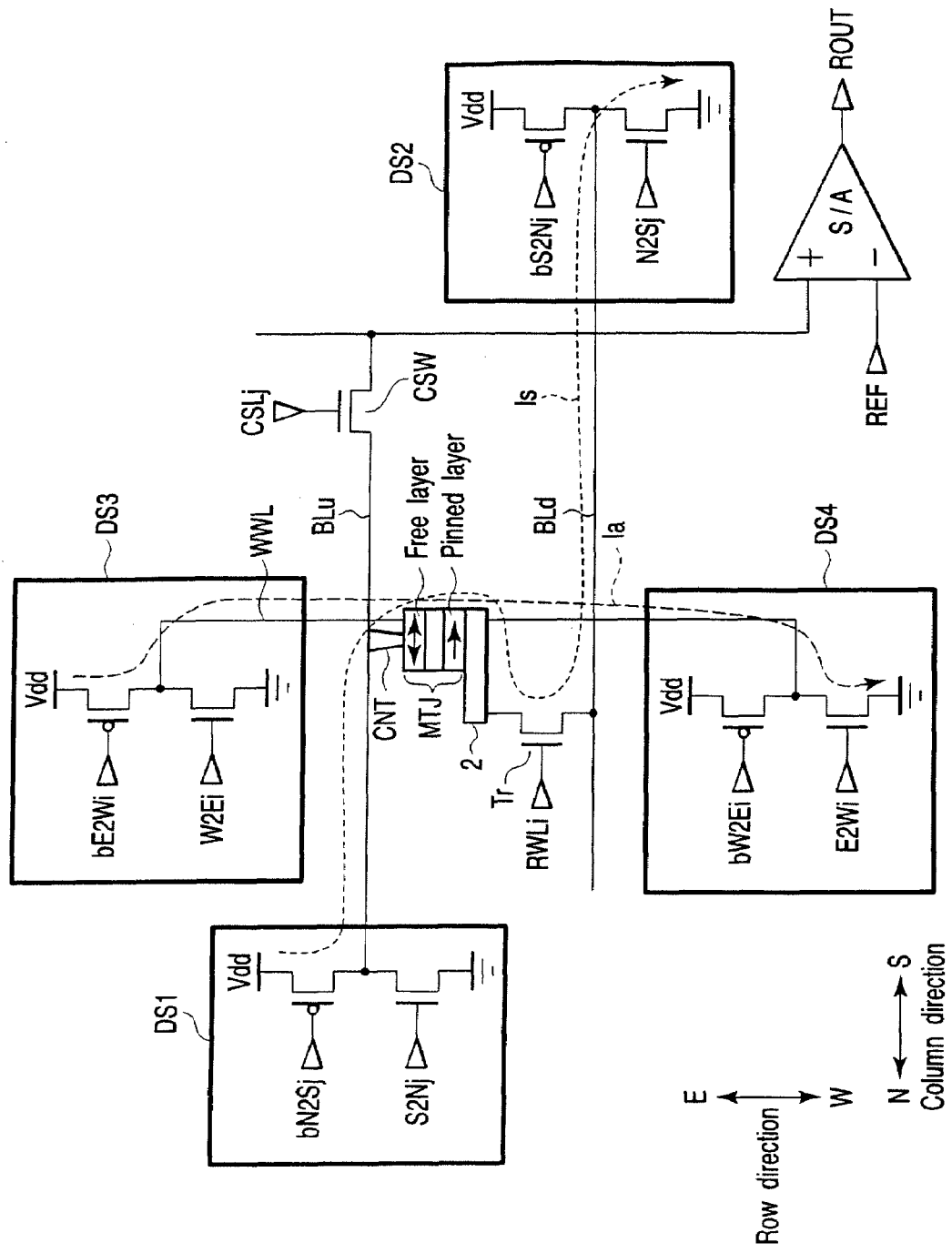
FIG. 21 is a circuit diagram showing a peripheral circuit of a magnetic random access memory according to an embodiment of the invention.

FIG. 21 schematically shows a peripheral circuit of the magnetic random access memory for realizing the spin-injection magnetization reversal.

In the signs used in FIG. 21, the signs beginning with the letter "b" should mean an inversion signal in which the logic of the corresponding companion sign is inversed. Further, i should mean the ith row in the plural rows, and j should mean the jth column in the plural columns.

One end of the magnetoresistive element MTJ is connected to the upper bit line BLu through a contact member CNT. The other end of the magnetoresistive element MTJ is connected to the lower bit line BLd through the ground layer 2 which is of the lower electrode and a MOS transistor Tr which is of the selection switch. A row selection signal RWLi from the read-out word line is inputted to a gate of the N-channel MOS transistor Tr.

Both the upper bit line BLu and the lower bit line BLd extend in the same direction. That is, in the example, the upper bit line BLu and the lower bit line BLd extend in the column direction (N←→S).

One end of the upper bit line BLu is connected to a CMOS type driver/sinker DS1. A drive signal bN2Sj is inputted to the gate of a P-channel MOS transistor constituting the driver/sinker DS1, and a sync signal S2Nj is inputted to the gate of the N-channel MOS transistor constituting the driver/sinker DS1.

One end of the lower bit line BLu is connected to a CMOS type driver/sinker DS2. A drive signal bS2Nj is inputted to the gate of the P-channel MOS transistor constituting the driver/sinker DS2, and a sync signal N2Sj is inputted to the gate of the N-channel MOS transistor constituting the driver/sinker DS2.

For example, the row selection signal RWLi is set at "H", the drive signal bN2Sj and the sync signal S2Nj are set at "L", and the drive signal bS2Nj and the sync signal N2Sj are set at "H", which results in the passage of the spin-injection current Is from the driver/sinker DS1 toward the driver/sinker DS2.

On the other hand, the row selection signal RWLi is set at "H", the drive signal bN2Sj and the sync signal S2Nj are set at "H", and the drive signal bS2Nj and the sync signal N2Sj are set at "L", which results in the passage of the spin-injection current Is from the driver/sinker DS2 toward the driver/sinker DS1.

The writing word line WWL extending in the row direction (E←→W) is arranged near the magnetoresistive element MTJ.

One end of the writing word line WWL is connected to a CMOS type driver/sinker DS3. A drive signal bE2Wi is inputted to the gate of the P-channel MOS transistor constituting the driver/sinker DS3, and a sync signal W2Ei is inputted to the gate of the N-channel MOS transistor constituting the driver/sinker DS3.

The other end of the writing word line WWL is connected to a CMOS type driver/sinker DS4. A drive signal bW2Ei is inputted to the gate of the P-channel MOS transistor constituting the driver/sinker DS4, and a sync signal E2Wi is inputted to the gate of the N-channel MOS transistor constituting the driver/sinker DS4.

For example, the drive signal bE2Wi and the sync signal E2Wi are set at "L" and the drive signal bW2Ei and the sync signal E2Wi are set at "H", which results in the passage of the assist current Ia from the driver/sinker DS3 toward the driver/sinker DS4.

On the other hand, the drive signal bE2Wi and the sync signal W2Ei are set at "H" and the drive signal bW2Ei and the sync signal E2Wi are set at "L", which results in the passage of the assist current Ia from the driver/sinker DS4 toward the driver/sinker DS3.

The other end of the upper bit line BLu is connected to a positive-side input terminal of a sense amplifier S/A through an N-channel MOS transistor CSW, which is of the column selection switch. The sense amplifier S/A includes, e.g., a differential amplifier. A column selection signal CSLj is inputted to the gate of the MOS transistor CSW.

A reference potential REF is inputted to a negative-side input terminal of the sense amplifier S/A. The reference potential REF becomes a reference for determining the value of the readout data from the magnetoresistive element MTJ. An output signal of the sense amplifier S/A becomes readout data ROUT of the magnetoresistive element MTJ.

(2) Signal Timing Waveform

Figure 22:
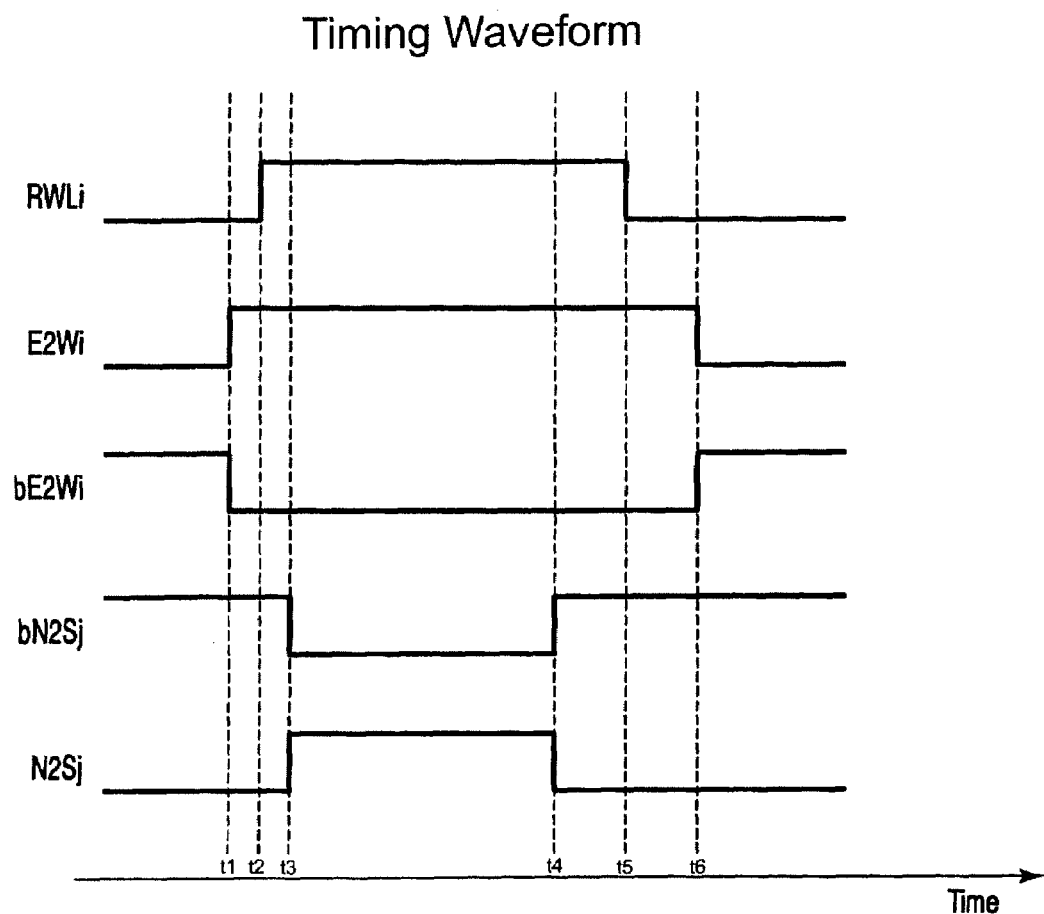
FIG. 22 is a waveform chart showing a waveform of a signal used for the memory of FIG. 21.

FIG. 22 shows waveforms of the drive signal and the sync signal, which are used for the magnetic random access memory of FIG. 21.

The signal timing waveform of FIG. 22 is one example in which the spin-injection current Is and the assist current Ia shown in FIG. 21 are generated.

First, at a time t1, the sync signal E2Wi is set at "H" and the drive signal bE2Wi is set at "L", which results in the passage of the assist current Ia through the writing word line WWL from the driver/sinker DS3 toward the driver/sinker DS4.

The readout selection signal RWLi is set at "H" at a time t2. Then, the sync signal N2Sj is set at "H" and the drive signal bN2Sj is set at "L" at a time t3, which results in the passage of the spin-injection current Is from the driver/sinker DS1 toward the driver/sinker DS2.

After that, at a time t4, the sync signals N2Sj is set at "L", the drive signal bN2Sj is set at "H", and the spin-injection current Is is cut off. Then, at a time t5, the readout selection signal RWLi is set at "L".

At a time t6 when tens nanoseconds elapse since the spin-injection current Is is cut off, the sync signal E2Wi is set at "L", the drive signal bE2Wi is set at "H", the assist current Ia is cut off, and the assist magnetic field H is eliminated.

In the signal timing waveform of the example, the assist current Ia is passed to generate the assist magnetic field H prior to the passage of the spin-injection current Is. However, as described above, the assist magnetic field H may be generated at the same time of the passage of the spin-injection current Is or after the passage of the spin-injection current Is.

(3) Decoder

Examples of a decoder, which controls the control the driver/sinkers DS1, DS2, DS3, and DS4 of FIG. 21 will be described below.

During the data writing in the magnetoresistive element, the decoder controls the driver/sinker to determine the directions of the spin-injection current Is and the assist current Ia according to the value of the writing data. The decoder also controls the driver/sinker to determine the timing of the supply/cutoff of the spin-injection current Is and the assist current Ia.

Figure 23:
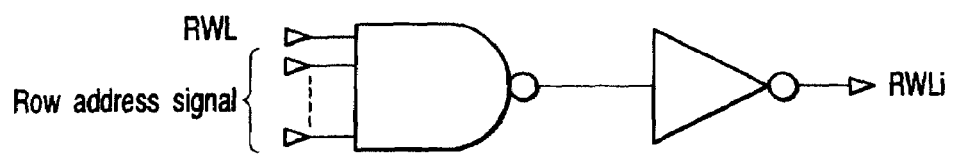
FIG. 23 shows an example of a decoder.

FIG. 23 shows an example of the decoder, which generates the readout selection signal RWLi.

In this example, the decoder includes an AND gate circuit. The readout selection signal RWLi becomes "H" when both an active signal RWL and a row address signal are set in "H".

Figure 24:
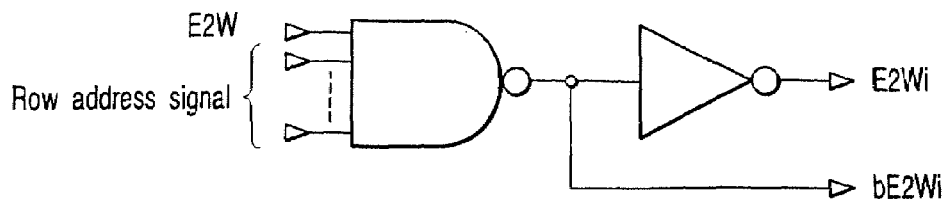
FIG. 24 shows the example of the decoder.

FIG. 24 shows an example of the decoder, which generates the drive signals bE2Wi and the sync signal E2Wi.

In this example, the decoder includes the AND gate circuit. The drive signal bE2Wi becomes "L" and the sync signal E2Wi becomes "H", when both an active signal E2W and a row address signal are set in "H".

Figure 25:
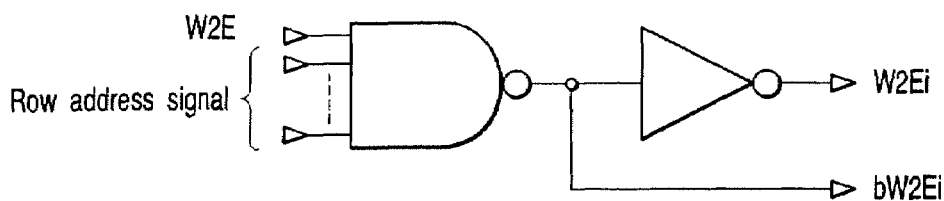
FIG. 25 shows the example of the decoder.

FIG. 25 shows an example of the decoder, which generates the drive signals bW2Ei and the sync signal W2Ei.

In this example, the decoder includes the AND gate circuit. The drive signals bW2Ei and the sync signal W2Ei become "H", when both an active signal W2E and the row address signal are set in "H".

Figure 26:
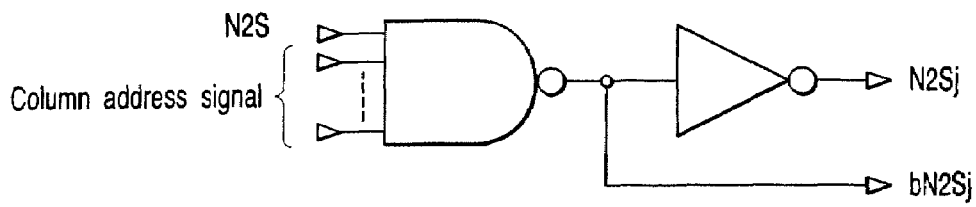
FIG. 26 shows the example of the decoder.

FIG. 26 shows an example of the decoder which generates the drive signals bN2Sj and the sync signal N2Sj.

In this example, the decoder includes the AND gate circuit. The drive signal bN2Sj becomes "L" and the sync signal N2Sj becomes "H", when both an active signal N2S and a column address signal are set in "H".

Figure 27:
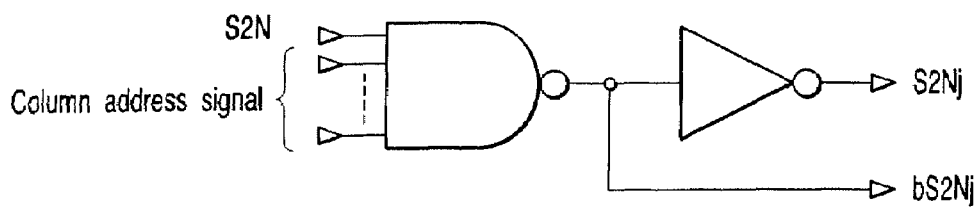
FIG. 27 shows the example of the decoder.
Figure 28:
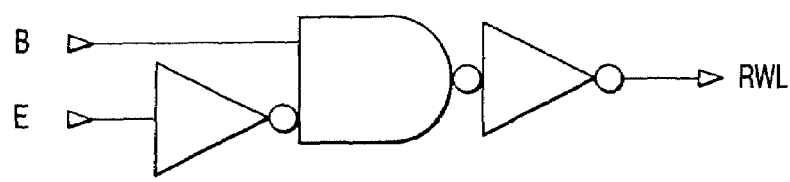
FIG. 28 shows an example of an active signal RWL generating circuit.

FIG. 27 shows an example of the decoder, which generates the drive signals bS2Nj and the sync signal S2Nj.

In this example, the decoder includes the AND gate circuit. The drive signal bS2Nj becomes "L" and the sync signal S2Nj becomes "H", when both an active signal S2N and the column address signal are set in "H".

FIGS. 28 to 32 show circuits, which generate the active signals RWL, E2W, W2E, N2S, and S2N.

Signals A, B, C, D, E and F determine the timing in which the signals RWL, E2W, W2E, N2S, and S2N are outputted respectively.

In FIGS. 29 to 32, DATA1 is the signal which becomes "H" when the writing data is "1" and DATA0 is the signal which becomes "H" when the writing data is "0".

Accordingly, the directions of the spin-injection current Is and the assist current Ia are determined according to the value of the writing data.

In the examples, the timing of the passage of the assist current Ia is set before the passage of the spin-injection current Is. However, the timing of the passage of the assist current Ia may be set at the same time of the passage of the spin-injection current Is or after the passage of the spin-injection current Is.

Figure 33:
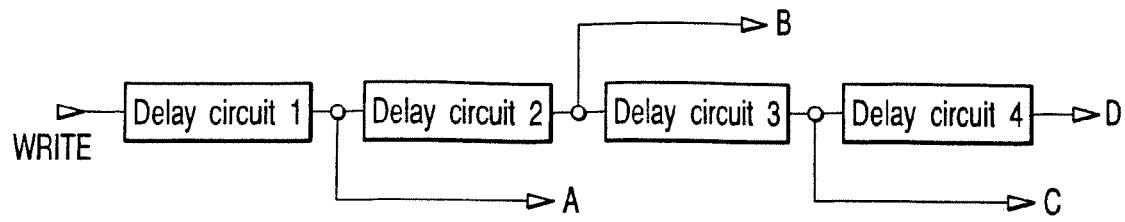
FIG. 33 shows an example of a circuit, which determines timing of an active signal.
Figure 34:
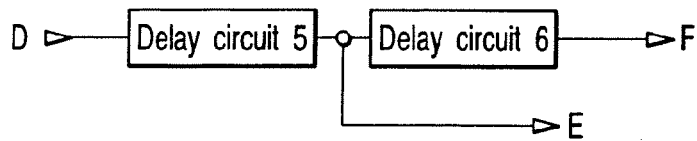
FIG. 34 shows the example of the circuit, which determines the timing of the active signal.

FIGS. 33 and 34 show delay circuits 1 to 6, which generate the signals A, B, C, D, E, and F. based on a writing signal WRITE.

Figure 35:
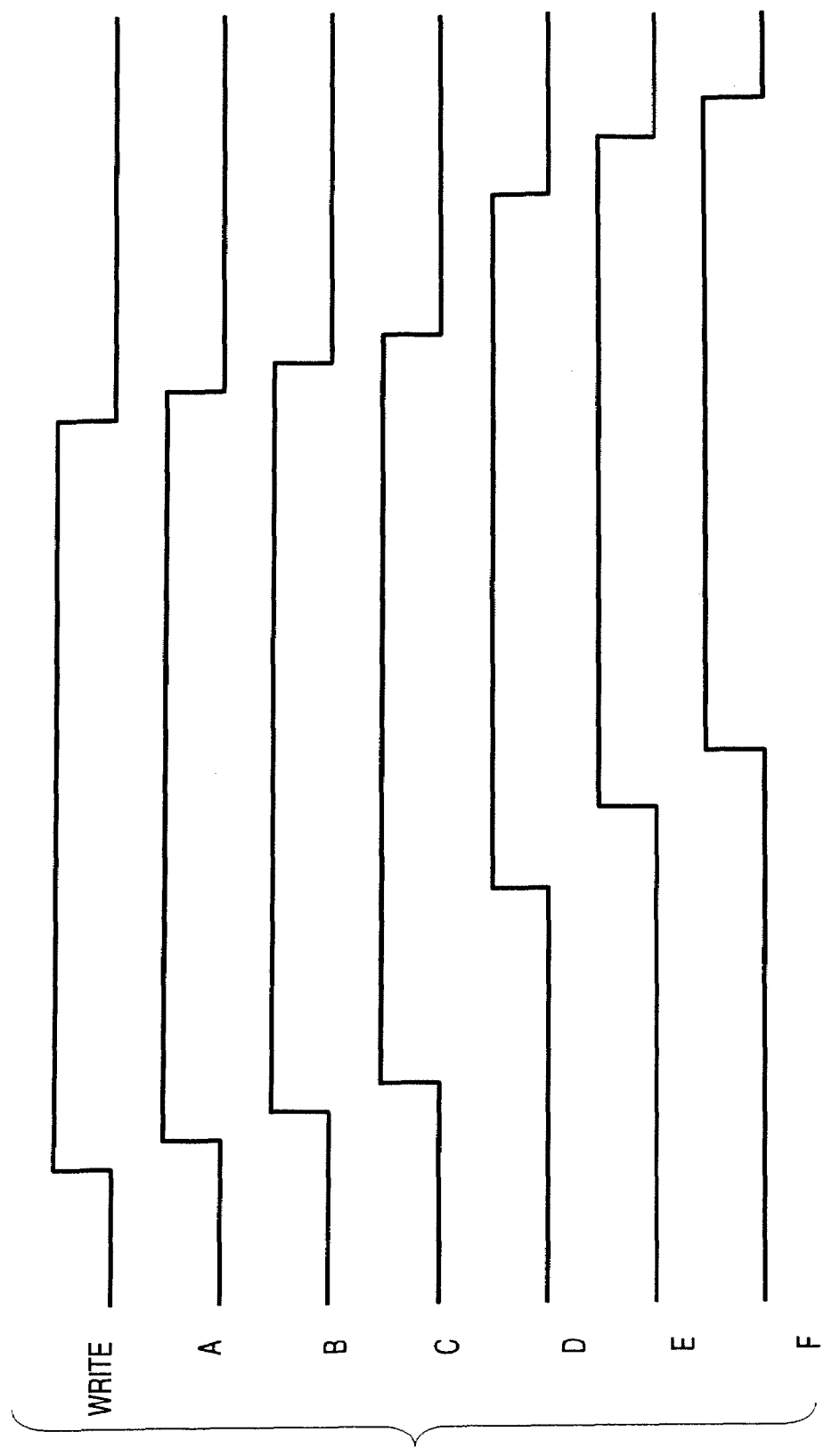
FIG. 35 is a waveform chart showing signals outputted from the circuits of FIGS. 33 and 34.
Figure 39:
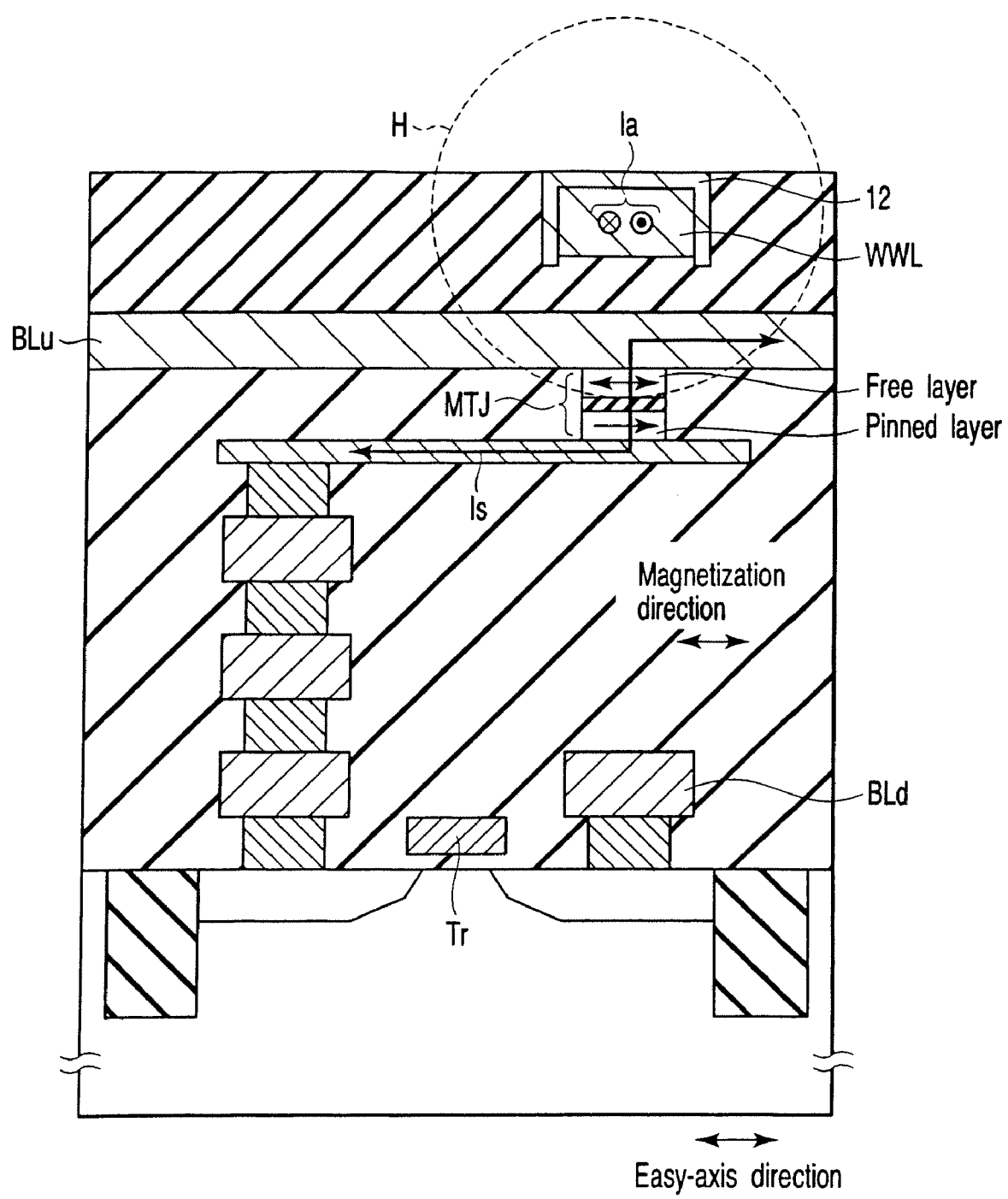
FIG. 39 is a sectional view showing the modification of the first embodiment of the structure.
Figure 40:
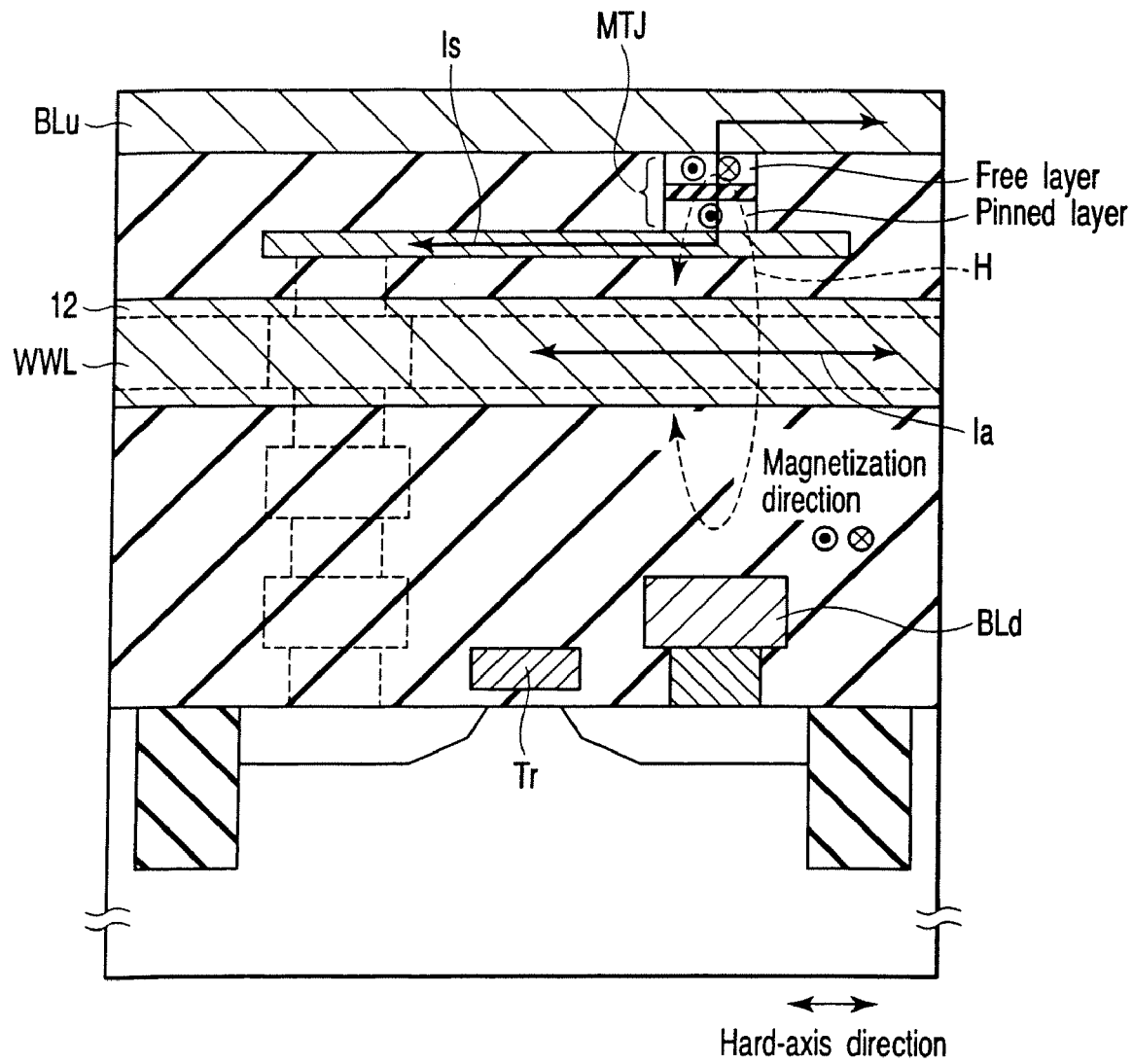
FIG. 40 is a sectional view showing the modification of the first embodiment of the structure.

FIG. 35 shows operation waveforms of the delay circuits 1 to 6 of FIGS. 33 and 34.

Figure 36:
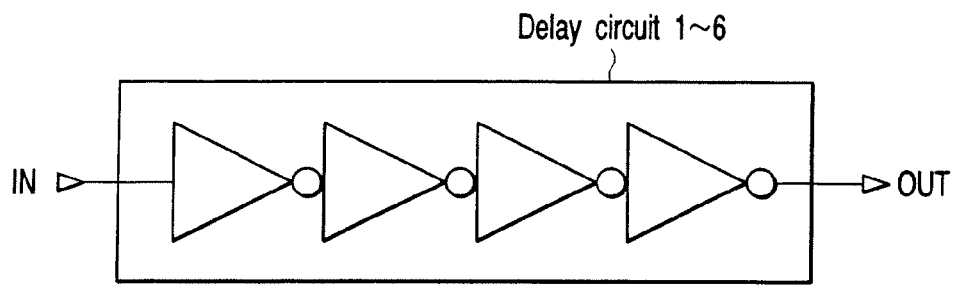
FIG. 36 shows an example of a delay circuit.
Figure 37:
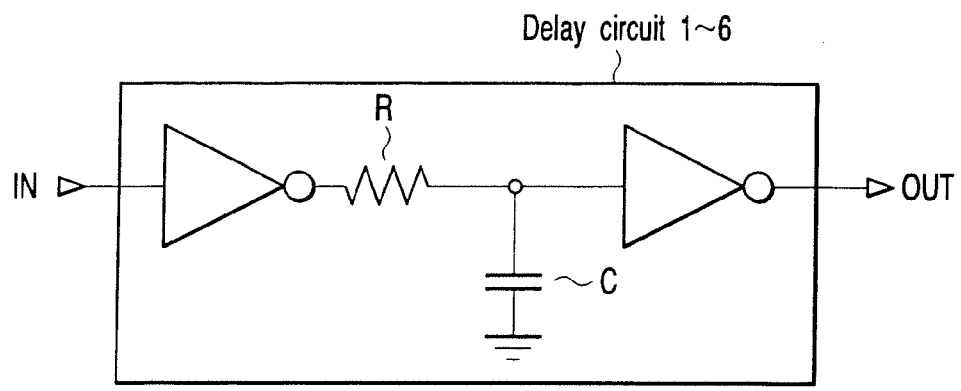
FIG. 37 shows the example of the delay circuit.

FIGS. 36 and 37 show examples of the delay circuits 1 to 6.

The example of FIG. 36 is an inverter type in which the delay circuit is formed by the plural inverters connected in series. The delay time can be controlled by the number of inverters. The example of FIG. 37 is an RC type in which the delay circuit is formed by a resistor R and a capacitance C.

The delay time can be controlled by a resistance value of the resistor R and a capacitance value of the capacitance C.

3. Modifications

Modifications of the structure (see FIGS. 3 to 10) according to the embodiments of the invention will be described below.

(1) First Modification

FIGS. 38 to 45 show the modifications of the structure according to the embodiments of the invention.

The modifications have the so-called yoke wiring structure in which a magnetic layer 12 made of a soft magnetic material (yoke material) is arranged around the writing word line WWL in order to efficiently impart the assist magnetic field H to the magnetoresistive element MTJ.

According to the yoke wiring structure, the assist current Ia for generating the assist magnetic field H can be further decreased. Specifically the assist current Ia can be set at values not more than 0.5 mA.

The structures shown in FIGS. 38 to 45 correspond to the structures shown in FIGS. 3 to 10 respectively.

(2) Second Modification

With reference to the magnetoresistive element, the following modifications can be performed.

In the magnetoresistive elements shown in FIGS. 11 to 18, the anti-ferromagnetic layer 3 or 9 can be made of the materials such as Fe—Mn, Pt—Mn, Pt—Cr—Mn, Ni—Mn, Ir—Mn, NiO, and $Fe_2O_3$.

The first and second magnetic fixed layers 4 or 4SAF and 8 or 8SAF can be made of the material having unidirectional anisotropy, and the magnetic recording layer 6 can be made of the material having uniaxial anisotropy. The thicknesses of the ferromagnetic layers constituting the first second magnetic fixed layers 4 or 4SAF and 8 or 8SAF and the magnetic recording layer 6 are set in the range of 0.1 nm to 100 nm. In order to ensure that the ferromagnetic body is not changed to the superparamagnetic body, it is preferable that the thicknesses of the ferromagnetic layers are not lower than 0.4 nm.

In the magnetoresistive elements shown in FIGS. 15 to 18, the columnar layer, which is of the ferromagnetic particles partitioned by the dielectric body can be made of Co, Fe, or Ni or the alloy thereof, or at least one metal selected from the group of Co—Pt, Co—Fe—Pt, Fe—Pt, Co—Fe—Cr—Pt, and Co—Cr—Pt.

In the magnetic recording layer 6 of the magnetoresistive element shown in FIGS. 11 to 18, physical properties such as the magnetic properties, the crystallinity, the mechanical properties, and the chemical properties can be adjusted by adding the non-magnetic elements such as Ag, Cu, Au, Al, Ru, Os, Re, Ta, B, C, O, N, Pd, Pt, Zr, Ir, W, Mo, and Nb to the magnetic material.

4. Experimental Example

Then, experimental examples will be described.

(1) First Experimental Example

A first experimental example is a spin-injection magnetic random access memory, which includes the structure of FIG. 6 and the circuits of FIGS. 21 to 37.

The magnetoresistive element whose magnetic fixed layer has the SAF structure shown in FIG. 12 or 14 is used as the magnetoresistive element of the first experimental example.

The procedure of producing the first experimental example is as follows:

First the MOS transistors and the writing word lines WWL are formed on the semiconductor substrate. Then, the magnetoresistive element whose magnetic fixed layer has the SAF structure shown in FIG. 12 or 14 is formed.

In the case of the magnetoresistive element (sample 1a) of FIG. 12, lamination of Ta/Cu/Ta is formed as the ground layer (electrode layer) 2.

The anti-ferromagnetic layer 3 made of Ru (5 nm)/PtMn (20 nm) is formed on the ground layer 2. The first magnetic fixed layer 4 made of $Co_{75}Fe_{25}$ (5 nm), the tunnel barrier layer 5 made of $AlO_X$ (1.4 nm), and the magnetic recording layer 6 made of $Co_{90}Fe_{10}$ (3 nm) are sequentially formed on the anti-ferromagnetic layer 3.

The non-magnetic metal layer 7 made of Cu (5 nm) is formed on the magnetic recording layer 6. The second magnetic fixed layer 8SAF made of $Co_{75}Fe_{25}$ (5 nm)/Ru (0.9 nm)/$Co_{75}Fe_{25}$ (5 nm) is formed on the non-magnetic metal layer 7. The anti-ferromagnetic layer 9 made of PtMn (20 nm)/Ru (5 nm) is formed on the second magnetic fixed layer 8SAF.

Then, the electrode layer 10 made of Ta (150 nm) is formed on the anti-ferromagnetic layer 9.

In the case of the magnetoresistive element (sample 1b) of FIG. 14, the lamination of Ta/Cu/Ta is formed as the ground layer (electrode layer) 2.

The anti-ferromagnetic layer 3 made of Ru (5 nm)/PtMn (20 nm) is formed on the ground layer 2. The first magnetic fixed layer 4SAF made of $Co_{75}Fe_{25}$ (5 nm)/Ru (0.9 nm)/$Co_{75}Fe_{25}$ (5 nm) is formed on the anti-ferromagnetic layer 3. The tunnel barrier layer 5 made of $AlO_X$ (1.4 nm) and the magnetic recording layer 6 made of $Co_{90}Fe_{10}$ (3 nm) are sequentially formed on the first magnetic fixed layer 4SAF.

The non-magnetic metal layer 7 made of Cu (5 nm) is formed on the magnetic recording layer 6. The second magnetic fixed layer 8SAF made of $Co_{75}Fe_{25}$ (5 nm)/Ru (0.9 nm)/$Co_{75}Fe_{25}$ (5 nm) is formed on the non-magnetic metal layer 7. The anti-ferromagnetic layer 9 made of PtMn (20 nm)/Ru (5 nm) is formed on the second magnetic fixed layer 8SAF.

Then, the electrode layer 10 made of Ta (150 nm) is formed on the anti-ferromagnetic layer 9.

At this point, for example, after Al having the thickness of 0.6 nm is formed, the tunnel barrier layer 5 made of $AlO_X$ having the thickness of 1.4 nm can be produced by repeating the process twice in which Al is naturally oxidized in situ with pure oxygen.

The cross-sectional observation of the thickness of $AlO_X$ produced through the above processes with TEM (Transmission Electron Microscope) confirms that the thickness of $AlO_X$ becomes 1.4 nm due to the oxidation while the total thickness of Al layers is 1.2(=0.6+0.6) nm.

The tunnel junction in the portion, which defines the junction area can be formed with an EB (Electron Beam) imaging apparatus, and the tunnel junction in other portions can be formed with KrF stepper apparatus. The junction area is 0.1× 0.15 µm2.

After junction isolation is performed, a protection made of $SiO_X$ whose thickness is 35 nm is formed, and the electrode made of Ta/Ru is formed. Then, after a contact layer is exposed by etch back, contact cleaning is performed to formed the upper electrode made of Ti (15 nm)/Al (300 nm)/Ti (15 nm). Then, the annealing is performed to impart the uniaxial anisotropy to the magnetoresistive element at 280° C. for 10 hours while the magnetic field is applied in the major axis of the magnetic layer.

Figure 46:
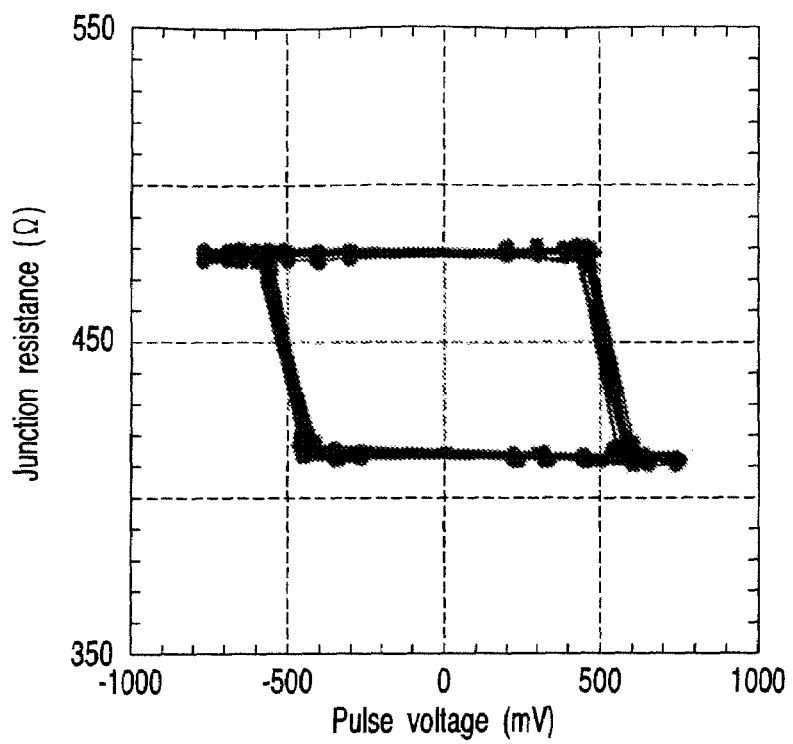
FIG. 46 shows the thermal disturbance of the magnetoresistive element.
Figure 47:
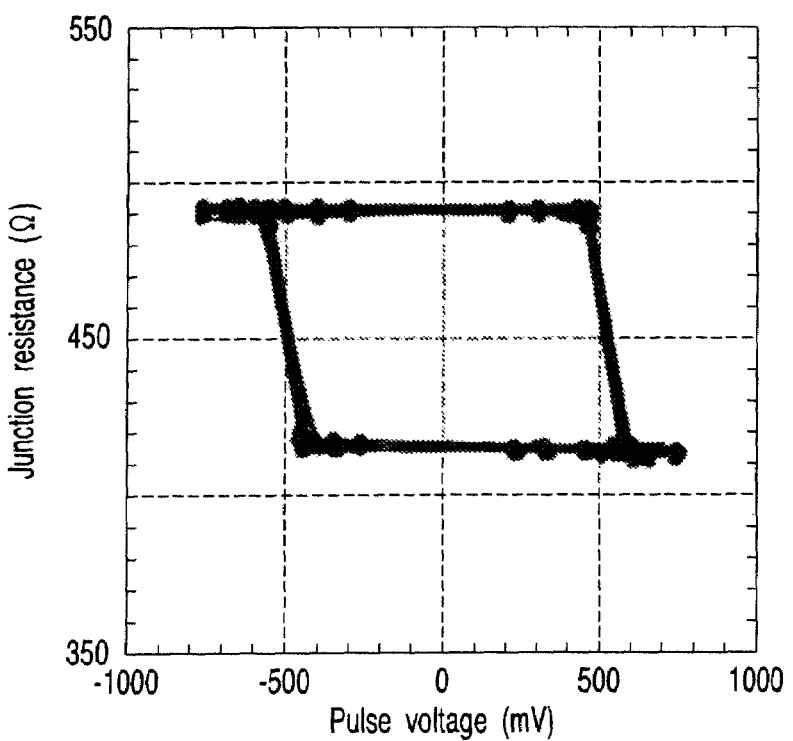
FIG. 47 shows the thermal disturbance of the magnetoresistive element.

FIG. 46 shows thermal disturbance of the magnetoresistive element (sample 1a) according to the first experimental example, and FIG. 47 shows thermal disturbance of the magnetoresistive element (sample 1b) according to the first experimental example.

When the results shown in FIGS. 46 and 47 are obtained, in order to make clear the difference in effect between the prior art (FIG. 1) and the invention, the same conditions as that in the prior art are substantially adopted. This is, the spin-injection writing time is set at 50 ns, the assist current is set at 0.4 mA, and the delay time between the cutoff of the spin-injection current and the cutoff of the assist current is set at 20 ns.

As can be seen from these drawings, in the samples 1a and 1b of the first experimental example, the fluctuation in current density of the pulse current (corresponding to pulse voltage) and the fluctuation in magnetoresistance fluctuation rate (corresponding to junction resistance) of the post-switching are largely decreased. In the magnetization reversal (switching), it is necessary to decrease the fluctuation in current density of the pulse current and the fluctuation in magnetoresistance fluctuation rate of the post-switching.

These results can be obtained in a same manner, regardless of the timing of the assist magnetic field generation, i.e., the timing of the assist magnetic field generation is independent of the timing of the spin-injection current passage. Therefore, the results can contribute to the practical use of the large-capacity magnetic random access memory.

(2) Second Experimental Example

Figure 41:
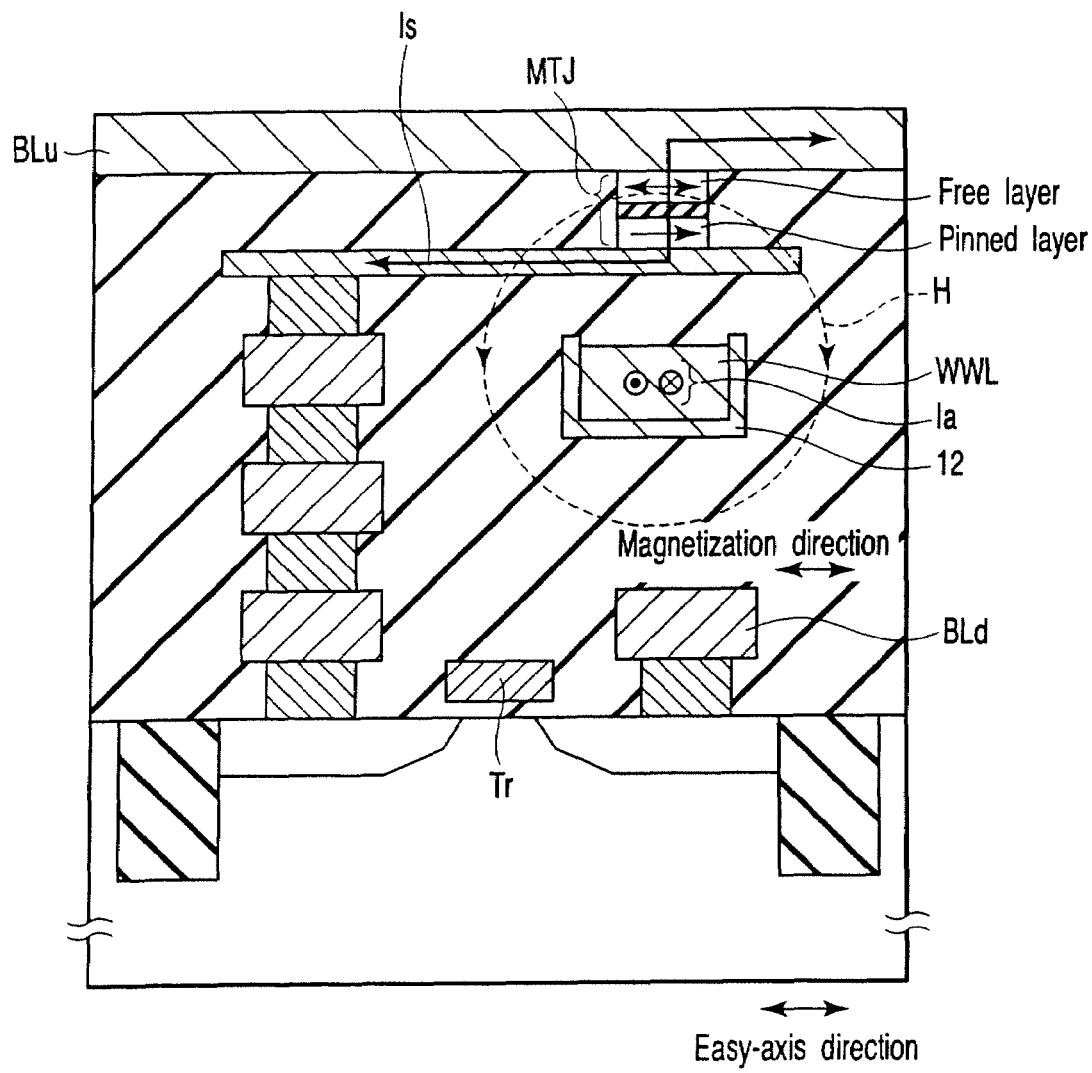
FIG. 41 is a sectional view showing the modification of the first embodiment of the structure.
Figure 42:
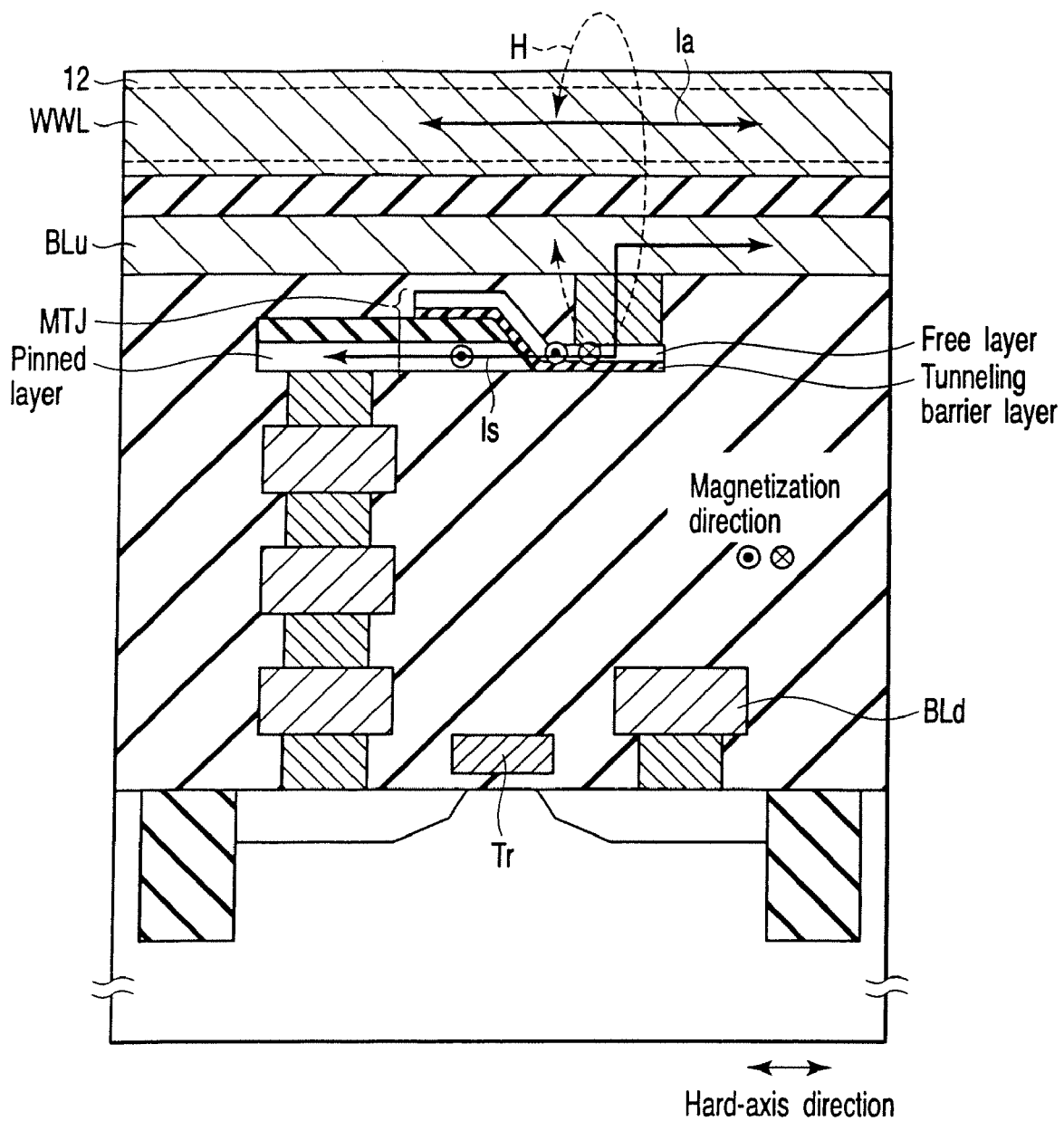
FIG. 42 is a sectional view showing a modification of the second embodiment of the structure.
Figure 43:
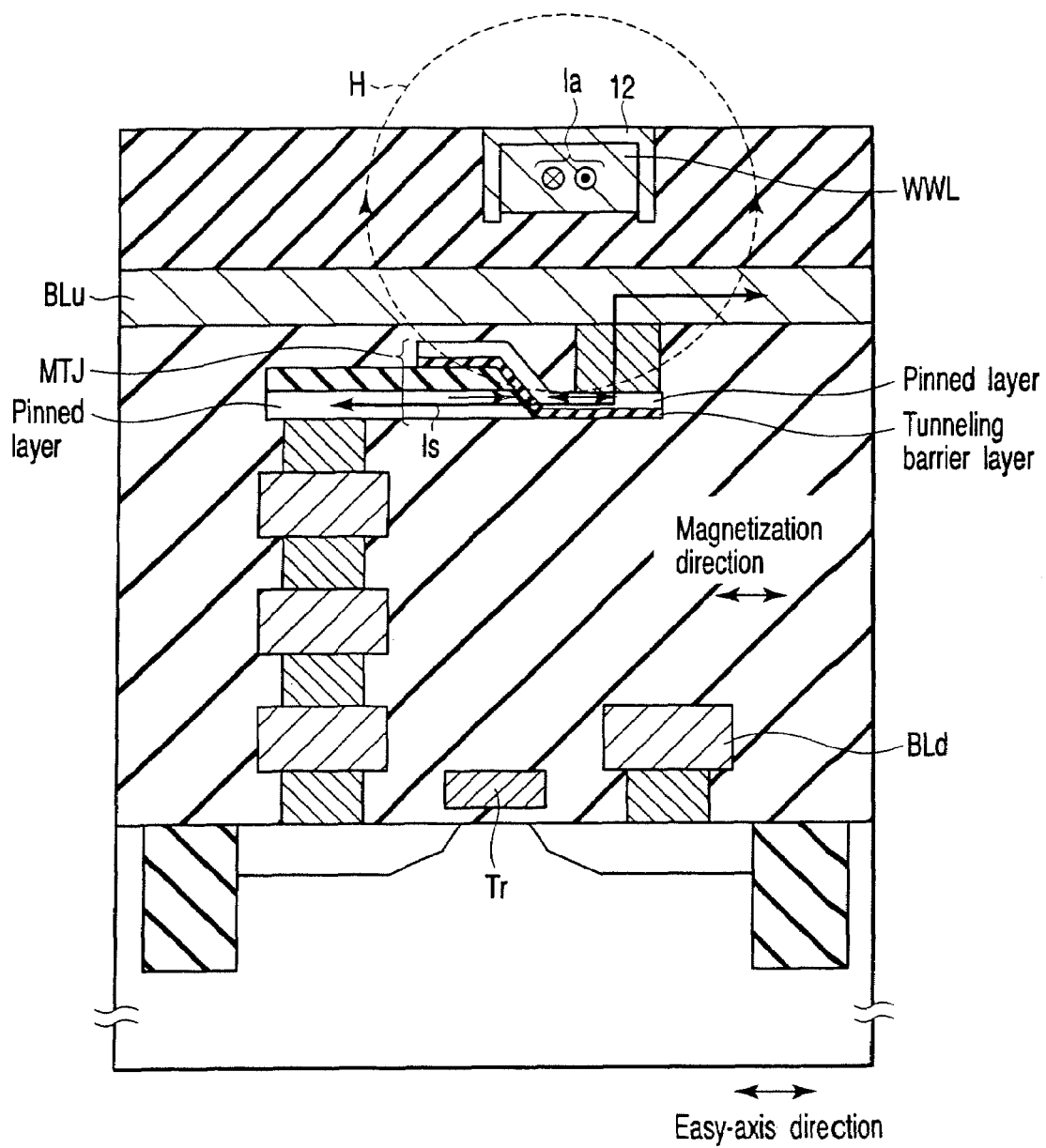
FIG. 43 is a sectional view showing the modification of the second embodiment of the structure.

A second experimental example is a spin-injection magnetic random access memory, which includes the structure of FIG. 41 and the circuits of FIGS. 21 to 37.

The magnetoresistive element whose magnetic fixed layer has the SAF structure shown in FIG. 12 or 14 is used as the magnetoresistive element of the first experimental example.

The procedure of producing the first experimental example is as follows:

First the MOS transistors and the writing word lines WWL having the yoke structure are formed on the semiconductor substrate. Then, the magnetoresistive element whose magnetic fixed layer has the SAF structure shown in FIG. 12 or 14 is formed.

In the case of the magnetoresistive element (sample 2a) of FIG. 12, for example, the lamination of Ta/Cu/Ta is formed as the ground layer (electrode layer) 2.

The anti-ferromagnetic layer 3 made of Ru (5 nm)/PtMn (20 nm) is formed on the ground layer 2. The first magnetic fixed layer 4 made of $Co_{65}Fe_{35}$ (5 nm), the tunnel barrier layer 5 made of MgO (0.9 nm), and the magnetic recording layer 6 made of $(Co_{65}Fe_{35})_{80}B_{20}$ (3.5 nm) are sequentially formed on the anti-ferromagnetic layer 3.

The non-magnetic metal layer 7 made of Rh (5 nm) is formed on the magnetic recording layer 6. The second magnetic fixed layer 8SAF made of $Co_{75}Fe_{25}$ (5 nm)/Ru (0.9 nm)/$Co_{75}Fe_{25}$ (5 nm) is formed on the non-magnetic metal layer 7. The anti-ferromagnetic layer 9 made of PtMn (20 nm)/Ru (5 nm) is formed on the second magnetic fixed layer 8SAF.

Then, the electrode layer 10 made of Ta (150 nm) is formed on the anti-ferromagnetic layer 9.

In the case of the magnetoresistive element (sample 2b) of FIG. 14, for example, the lamination of Ta/Cu/Ta is formed as the ground layer (electrode layer) 2.

The anti-ferromagnetic layer 3 made of Ru (5 nm)/PtMn (20 nm) is formed on the ground layer 2. The first magnetic fixed layer 4SAF made of $Co_{75}Fe_{25}$ (5 nm)/Ru (0.9 nm)/$Co_{75}Fe_{25}$ (5 nm) is formed on the anti-ferromagnetic layer 3.

The tunnel barrier layer 5 made of MgO (0.9 nm) and the magnetic recording layer 6 made of $(Co_{65}Fe_{35})_{80}B_{20}$ (3.5 mm) are sequentially formed on the first magnetic fixed layer 4SAF.

The non-magnetic metal layer 7 made of Rh (5 nm) is formed on the magnetic recording layer 6. The second magnetic fixed layer 8SAF made of $Co_{75}Fe_{25}$ (5 nm)/Ru (0.9 nm)/$Co_{75}Fe_{25}$ (5 nm) is formed on the non-magnetic metal layer 7. The anti-ferromagnetic layer 9 made of PtMn (20 nm)/Ru (5 nm) is formed on the second magnetic fixed layer 8SAF.

Then, the electrode layer 10 made of Ta (150 nm) is formed on the anti-ferromagnetic layer 9.

At this point, for example, after Mg can be formed by RF direct sputtering, the tunnel barrier layer 5 made of MgO having the thickness 0.9 nm can be produced by performing plasma oxidation for 3 seconds.

The uniaxial anisotropy of the magnetoresistive element can be imparted in the same way as the first experimental example.

FIG. 48 shows thermal disturbance of the magnetoresistive element (sample 2a) according to the second experimental example, and FIG. 49 shows thermal disturbance of the magnetoresistive element (sample 2b) according to the second experimental example.

When the results shown in FIGS. 48 and 49 are obtained, in order to make clear the difference in effects between the prior art (FIG. 1) and the invention, the same conditions as the prior art are substantially adopted. This is, the spin-injection writing time is set at 50 ns, the assist current is set at 0.2 mA, and the delay time between the cutoff of the spin-injection current and the cutoff of the assist current is set at 20 ns.

As can be seen from these drawings, in the samples 2a and 2b of the second experimental example, the fluctuation in current density of the pulse current (corresponding to pulse voltage) and the fluctuation in magnetoresistance fluctuation rate (corresponding to junction resistance) of the post-switching are largely decreased. In the magnetization reversal (switching), it is necessary to decrease the fluctuation in current density of the pulse current and the fluctuation in magnetoresistance fluctuation rate of the post-switching.

These results can be obtained in a same manner regardless of the timing of the assist magnetic field generation, i.e., the timing of the assist magnetic field generation is independent of the timing of the spin-injection current passage. Therefore, the results can contribute to the practical use of the large-capacity magnetic random access memory.

5. OTHER

As described above, according to the invention, in the spin-injection magnetic random access memory, the problems such as the tunnel barrier breakage and the thermal disturbance caused by the temperature rise of the magnetoresistive element can be solved by the new architecture and writing method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A random access memory with a magnetoresistive element, comprising:

a memory cell including a MOS transistor and a magnetoresistive element having a first magnetic fixed layer whose magnetization direction is fixed, a magnetic recording layer whose magnetization direction can be changed by injecting spin-polarized electrons, and a tunnel barrier layer which is provided between the magnetic fixed layer and the magnetic recording layer;

a bit line which passes a first current through the magnetoresistive element, the first current being used for generation of a spin-polarized electrons;

a word line through which a second current is passed, the second current being used for the generation of an assist magnetic field in a magnetization easy-axis direction of the magnetoresistive element;

a first driver connected to the bit line and supplies the first current;

a second driver connected to the word line and supplies the second current;

a first decoder which receives a writing data to be written into the magnetoresistive element and controls the first driver to determine a direction of the first current depending on the writing data, and determines timing of cutoff of the first current; and a second decoder which controls the second driver to determine the direction of the second current depending on the writing data, and makes the timing of the cutoff of the second current later than the timing of the cutoff of the first current.

2. The memory according to claim 1, wherein the bit line and the word line intersect each other.

3. The memory according to claim 1, wherein the bit line and the word line extend in parallel with each other.

4. The memory according to claim 1, wherein the second current is cut off at a time when at least 50 nanoseconds elapse since the first current is cut off.

5. The memory according to claim 1, wherein the second current is not more than 1 mA.

6. The memory according to claim 1, wherein the magnetoresistive element has a second magnetic fixed layer located on a side of the magnetic recording layer which is opposite the tunnel barrier layer, the second magnetic fixed layer having magnetization fixed in an opposite direction to the magnetization direction of the first magnetic fixed layer.

7. The memory according to claim 1, wherein the magnetoresistive element has a second magnetic fixed layer located on a side of the magnetic recording layer which is opposite the tunnel barrier layer, the second magnetic fixed layer having magnetization fixed in a same direction as the magnetization direction of the first magnetic fixed layer.

8. The memory according to claim 1, wherein the magnetic recording layer is formed by a plurality of columnar layers which are partitioned by insulating bodies or dielectric bodies.

9. The memory according to claim 1, wherein the word line has a yoke wiring structure.

10. The memory according to claim 1, wherein the magnetoresistive element is arranged above a semiconductor substrate and the word line is arranged between the magnetoresistive element and the semiconductor substrate.

11. The memory according to claim 1, wherein the magnetoresistive element is arranged above a semiconductor substrate and the word line is arranged above the magnetoresistive element.

12. The memory according to claim 1, wherein one end of the magnetoresistive element is connected to the bit line and another end is connected to the MOS transistor.

* * * * *